US009000474B2

(12) United States Patent
Muramatsu et al.

(10) Patent No.: US 9,000,474 B2
(45) Date of Patent: Apr. 7, 2015

(54) WIRING SUBSTRATE, LIGHT EMITTING DEVICE, AND MANUFACTURING METHOD OF WIRING SUBSTRATE

(71) Applicant: Shinko Electric Industries Co., Ltd., Nagano-shi, Nagano (JP)

(72) Inventors: Shigetsugu Muramatsu, Nagano (JP); Hiroshi Shimizu, Nagano (JP); Kazutaka Kobayashi, Nagano (JP)

(73) Assignee: Shinko Electric Industries Co. Ltd., Nagano-shi, Nagano (JP)

( * ) Notice: Subject to any disclaimer, the term of this patent is extended or adjusted under 35 U.S.C. 154(b) by 147 days.

(21) Appl. No.: 13/748,903

(22) Filed: Jan. 24, 2013

(65) Prior Publication Data

US 2013/0187190 A1     Jul. 25, 2013

(30) Foreign Application Priority Data

Jan. 25, 2012   (JP) ................................. 2012-013241

(51) Int. Cl.
| H01L 33/00 | (2010.01) |
| H05K 1/02 | (2006.01) |
| H05K 13/00 | (2006.01) |
| H01L 25/075 | (2006.01) |
| H01L 33/62 | (2010.01) |
| H01L 33/64 | (2010.01) |

(52) U.S. Cl.
CPC .............. *H05K 1/0201* (2013.01); *H05K 13/00* (2013.01); *H01L 25/0753* (2013.01); *H01L 33/62* (2013.01); *H01L 2224/16225* (2013.01); *H01L 2924/19107* (2013.01); *H01L 33/644* (2013.01); *H01L 2933/0066* (2013.01); *H05K 2201/09409* (2013.01)

(58) Field of Classification Search
USPC ............ 257/99, 100, 676, E33.058, E33.075; 362/368, 373
See application file for complete search history.

(56) References Cited

U.S. PATENT DOCUMENTS

| 3,152,938 | A | 10/1964 | Osifchin et al. |
| 2003/0178227 | A1 | 9/2003 | Matsunaga et al. |
| 2006/0012991 | A1 | 1/2006 | Weaver, Jr. et al. |
| 2009/0103005 | A1* | 4/2009 | Nakazato et al. ............... 349/62 |
| 2009/0161343 | A1 | 6/2009 | Park et al. |
| 2009/0178828 | A1 | 7/2009 | Tsumura et al. |
| 2011/0132644 | A1 | 6/2011 | Nishi et al. |
| 2014/0153238 | A1* | 6/2014 | Nishimura et al. ........... 362/237 |

FOREIGN PATENT DOCUMENTS

| EP | 0 989 610 A2 | 3/2000 |
| EP | 1 261 028 A2 | 11/2002 |
| EP | 2 455 991 A1 | 5/2012 |
| JP | H05-218606 A | 8/1993 |
| JP | 2003-092011 A | 3/2003 |
| WO | WO 2011/007874 A1 | 1/2011 |

OTHER PUBLICATIONS

U.S. Appl. No. 13/749,070, Shinko Electric Industries Co., Ltd.
U.S. Appl. No. 13/749,096, Shinko Electric Industries Co., Ltd.

* cited by examiner

*Primary Examiner* — Minh-Loan Tran
(74) *Attorney, Agent, or Firm* — Drinker Biddle & Reath LLP

(57) ABSTRACT

There is provided a wiring substrate. The wiring substrate includes: a heat sink; a first insulating layer on the heat sink; a wiring pattern on the first insulating layer, wherein the wiring pattern is configured to mount a light emitting element thereon; and a second insulating layer on the first insulating layer such that the wiring pattern is exposed from the second insulating layer.

10 Claims, 26 Drawing Sheets

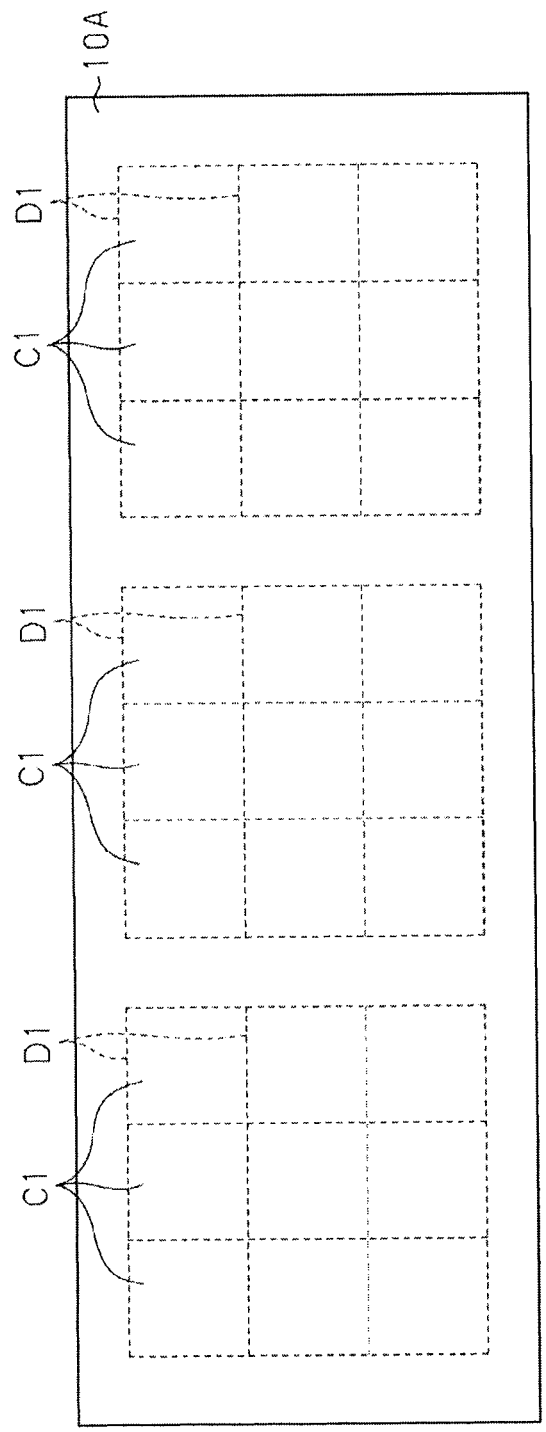

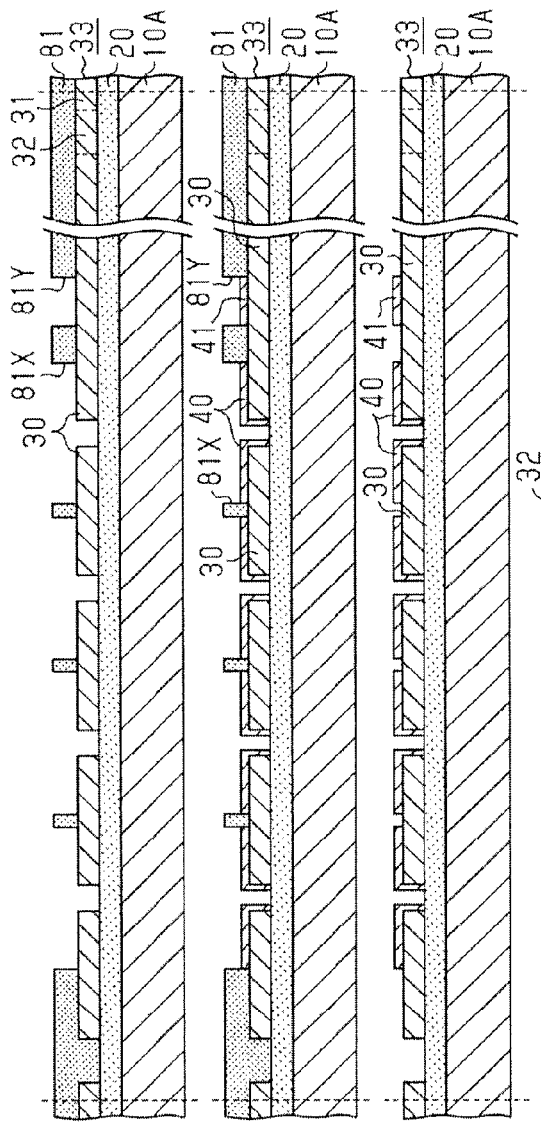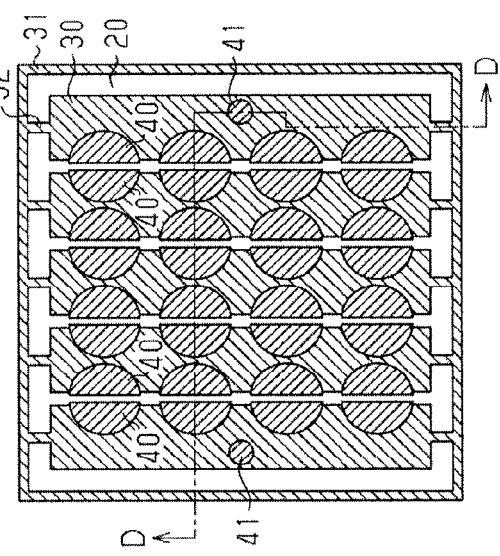
FIG. 6A
FIG. 6B
FIG. 6C
FIG. 6D

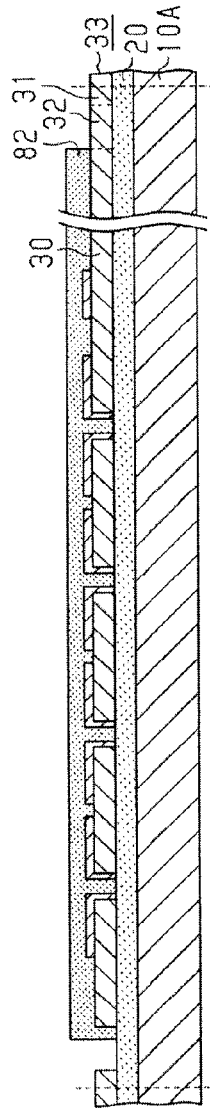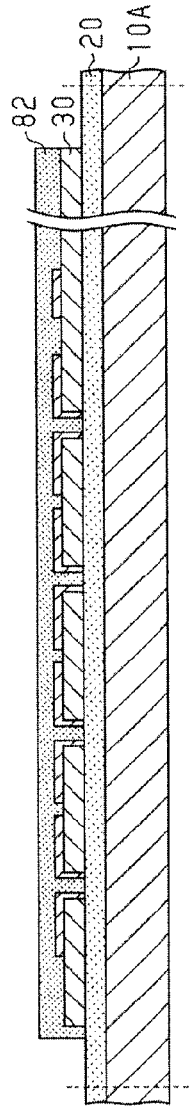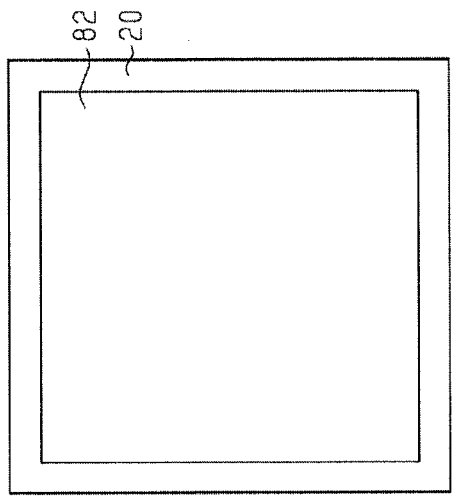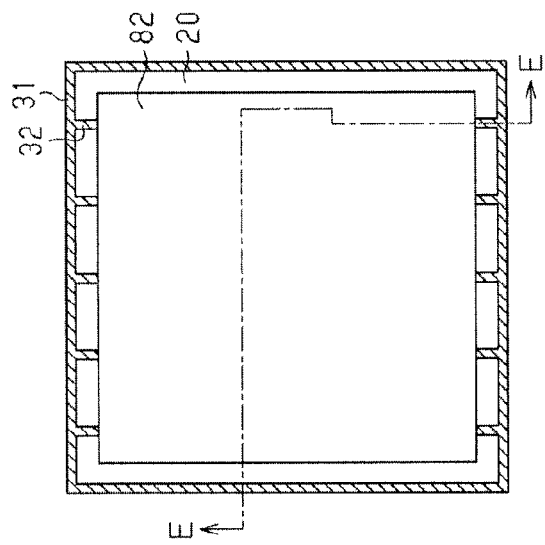

WIRING SUBSTRATE, LIGHT EMITTING DEVICE, AND MANUFACTURING METHOD OF WIRING SUBSTRATE

This application claims priority from Japanese Patent Application No. 2012-013241, filed on Jan. 25, 2012, the entire contents of which are herein incorporated by reference.

BACKGROUND

1. Technical Field

The present disclosure relates to a wiring substrate, a light emitting device, and a manufacturing method of the wiring substrate.

2. Description of the Related Art

In the related art, various shapes of light emitting devices in which light emitting elements are mounted on a substrate, have been proposed. As this kind of light emitting device, a structure is known in which wiring layers are formed on an insulating layer formed on a substrate made of metal, and a light emitting element such as a light emitting diode (LED) is mounted on the wiring layers (for example, see JP-A-2003-092011).

Here, in the light emitting device, when a light emitting diode is turned on, the light emitting diode generates heat, as a result, temperature increases, and thereby emission efficiency of the light emitting diode is reduced. For this reason, in order to dissipate heat generated from the light emitting diode with efficiency, heat is conducted to the substrate made of metal via the wiring layers and the insulating layer. However, since the insulating layer having low heat conductivity is interposed between the wiring layers and the substrate, there is a problem in that a heat dissipation performance deteriorates.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

According to one or more illustrative aspects of the present invention, there is provided a wiring substrate. The wiring substrate includes: a heat sink; a first insulating layer on the heat sink; a wiring pattern on the first insulating layer, wherein the wiring pattern is configured to mount a light emitting element thereon; and a second insulating layer on the first insulating layer such that the wiring pattern is exposed from the second insulating layer.

According to the aspect of the present invention, it is possible to provide a wiring substrate capable of improving heat dissipation performance.

Other aspects and advantages of the present invention will be apparent from the following description, the drawings and the claims.

BRIEF DESCRIPTION OF THE DRAWINGS

FIG. 4 is a schematic plan view illustrating a manufacturing method of the wiring substrate according to the first embodiment;

FIG. 5D is a schematic plan view illustrating the manufacturing steps of the wiring substrate according to the first embodiment, wherein FIGS. 5A to 5C show a cross-sectional view of the wiring substrate taken along the line C-C position of FIG. 5D.

FIGS. 6A to 6C are schematic cross-sectional views illustrating the manufacturing steps of the wiring substrate according to the first embodiment;

FIG. 6D is a schematic plan view illustrating the manufacturing steps of the wiring substrate according to the first embodiment, wherein FIGS. 6A to 6C show a cross-sectional view of the wiring substrate taken along the line D-D position of FIG. 6D;

FIGS. 7A and 7C are schematic cross-sectional views illustrating the manufacturing steps of the wiring substrate according to the first embodiment;

FIGS. 7B and 7D are schematic plan views illustrating the manufacturing steps of the wiring substrate according to the first embodiment, wherein FIGS. 7A and 7C show a cross-sectional view of the wiring substrate taken along the line E-E position of FIG. 7B;

FIGS. 9A and 9B are schematic cross-sectional views illustrating the manufacturing steps of the light emitting device according to the first embodiment, wherein FIGS. 9A and 9B show a cross-sectional view taken along the line B-B position of FIG. 3A;

FIGS. 10A to 10D are schematic cross-sectional views illustrating manufacturing steps of a wiring substrate and a light emitting device according to a modified example of the first embodiment, wherein FIGS. 10A to 10D show a cross-sectional view of the wiring substrate and the light emitting device taken along the line F-F position of FIG. 8A;

FIGS. 15A to 15C are schematic cross-sectional views illustrating manufacturing steps of a wiring substrate according to a second embodiment, wherein FIGS. 15A to 15C show a cross-sectional view of the wiring substrate taken along the line F-F position of FIG. 8A;

FIGS. 16A to 16D are schematic cross-sectional views illustrating manufacturing steps of a wiring substrate according to the second embodiment, wherein FIGS. 16A to 16D show a cross-sectional view of the wiring substrate taken along the line F-F position of FIG. 8A;

FIG. 18C is a schematic plan view illustrating the manufacturing steps of the wiring substrate according to the third embodiment, wherein FIGS. 18A, 18B and 18D show a cross-sectional view of the wiring substrate taken along the line I-I position of FIG. 18C;

FIG. 19B is a schematic plan view illustrating the manufacturing steps of the wiring substrate according to the third embodiment, wherein FIGS. 19A and 19C show a cross-sectional view of the wiring substrate taken along the line J-J position of FIG. 19B;

FIGS. 22A to 22C are schematic cross-sectional views illustrating the manufacturing steps of the wiring substrate according to a modified example of the third embodiment, wherein FIGS. 22A to 22C show a cross-sectional view of the wiring substrate taken along the line J-J position of FIG. 19B;

FIGS. 23A and 23B are schematic cross-sectional views illustrating the manufacturing steps of the wiring substrate according to the modified example, wherein FIGS. 23A and 23B show a cross-sectional view of the wiring substrate taken along the line J-J position of FIG. 19B;

FIGS. 24A and 24B are schematic cross-sectional views illustrating the manufacturing steps of the wiring substrate according to the modified example, wherein FIGS. 24A and 24B show a cross-sectional view of the wiring substrate taken along the line J-J position of FIG. 19B;

DETAILED DESCRIPTION OF EXEMPLARY EMBODIMENTS

Figure 1A:
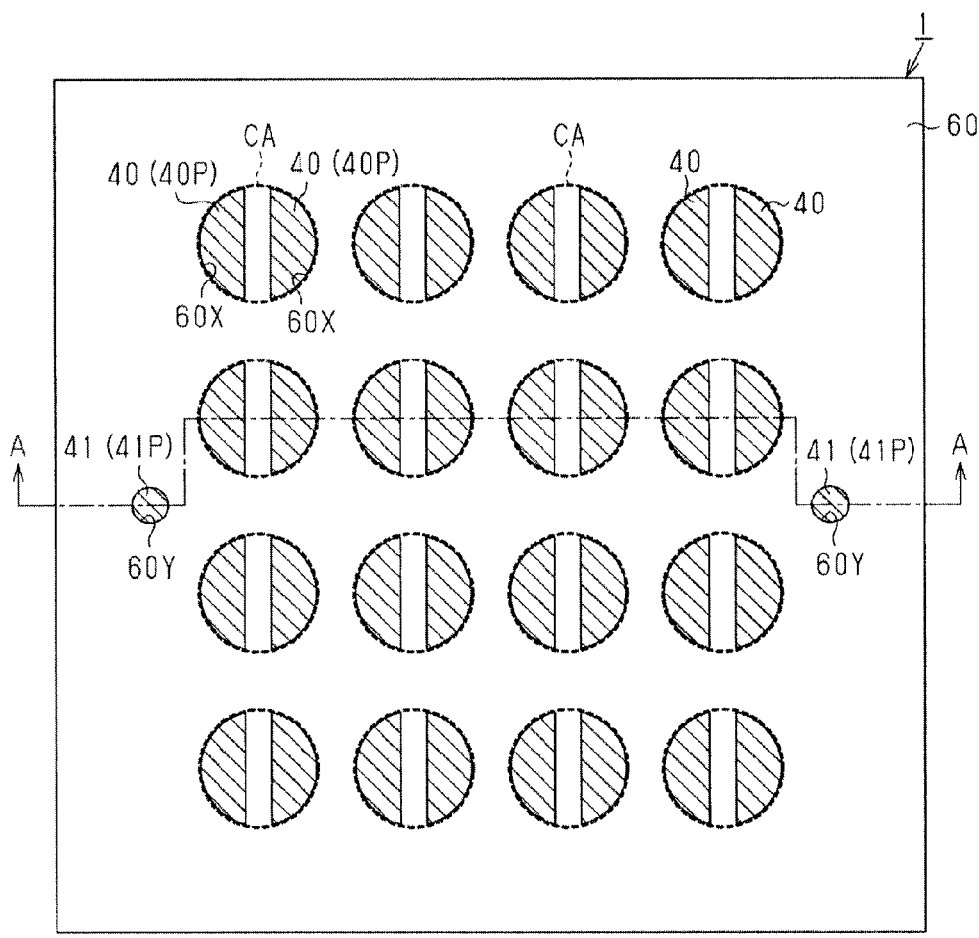
FIG. 1A is a schematic plan view illustrating a wiring substrate according to a first embodiment.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

In addition, for convenience, in the accompanying drawings, there are cases in which featured portions are shown appropriately enlarged to easily understand features thereof, and the dimensions of each constituent element may be different from practical dimensions thereof. Further, in a cross-sectional view, hatching of some members is omitted in order to easily understand a cross-sectional view of each member.

First Embodiment

Hereinafter, the first embodiment will be described with reference to FIGS. 1 to 9.

(Structure of Wiring Substrate)

Figure 1B:
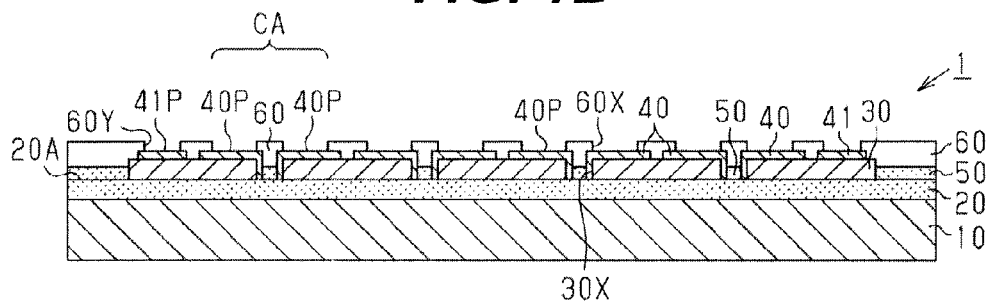
FIG. 1B is a schematic cross-sectional view taken along the line A-A of the wiring substrate shown in FIG. 1A.

As shown in FIG. 1B, a wiring substrate 1 includes a heat sink 10, an insulating layer 20 covering the upper surface of the heat sink 10, wiring patterns 30 formed on the insulating layer 20, metal layers 40 and 41 formed on a portion of the wiring patterns 30, insulating layers 50 covering a portion of the sides of the wiring patterns 30 or the sides of the metal layers 40, and an insulating layer 60 covering the wiring patterns 30 and the like. This wiring substrate 1 is a wiring substrate applied to, for example, a light emitting device.

The heat sink 10 is, for example, an approximately rectangular thin plate in plan view. As a material of the heat sink 10, for example, a metal with favorable heat conductivity such as copper (Cu) or aluminum (Al), or an alloy including at least one of these metals may be used. In addition, as a material of the heat sink 10, for example, a ceramic material with favorable heat conductivity such as aluminum nitride or alumina may be used. The thickness of the heat sink 10 may be, for example, about 0.5 mm to 1.0 mm.

The insulating layer 20 is formed so as to cover the entire upper surface of the heat sink 10. As a material of the insulating layer 20, for example, an insulating resin with high heat conductivity (for example, about 1 W/mK to 10 W/mK) may be used. Specifically, as a material of the insulating layer 20, for example, an insulating resin such as a polyimide resin or an epoxy resin, or a resin material where a filler such as silica or alumina is mixed with the resin may be used. The insulating layer 20 has a function of insulating the heat sink 10 from the wiring patterns 30, and a function of adhering the heat sink 10 to the wiring patterns 30.

The thickness of the insulating layer 20 may be, for example, about 50 μm to 80 μm. Further, in a case where the insulating layer 20 has high insulation properties, the insulating layer 20 is preferably formed thinly from the viewpoint of heat dissipation.

Figure 2:
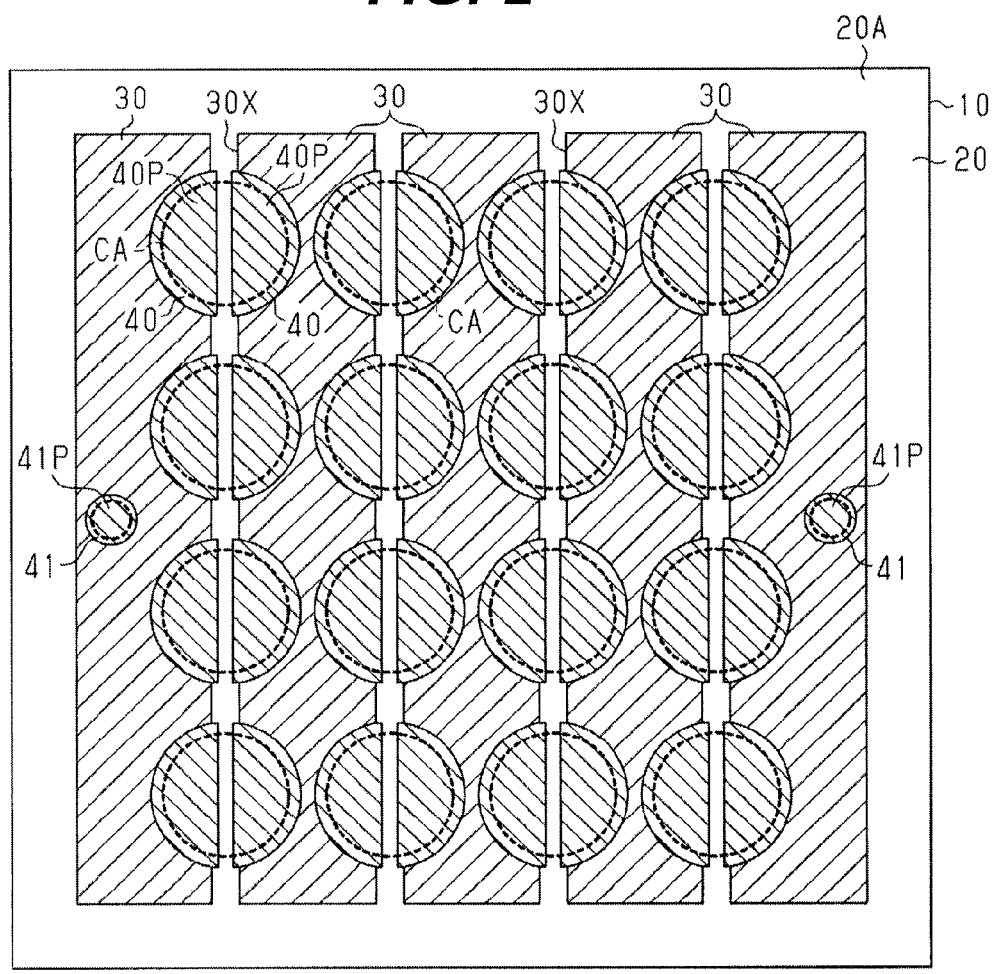
FIG. 2 is a schematic plan view illustrating a wiring pattern and a metal layer according to the first embodiment.

The wiring patterns 30 are formed on the first main surface 20A of the insulating layer 20. The wiring patterns 30, as shown in FIG. 2, are formed so as to entirely cover the central portion of the first main surface 20A of the insulating layer 20. Specifically, a plurality of (in FIG. 2, five) wiring patterns 30 with a strip shape in plan view (a rectangular shape in plan view) are disposed in parallel so as to be adjacent to each other. In addition, a groove-shaped opening 30X which exposes the underlying insulating layer 20 is formed between the adjacent wiring patterns 30. A plurality of wiring patterns 30 are separated from each other by this opening 30X. Further, as a material of the wiring patterns 30, for example, copper or a copper alloy may be used. The thickness of the wiring pattern 30 may be, for example, about 35 μm to 105 μm. In addition, the distance between the adjacent wiring patterns 30 (the width of the opening 30X) may be, for example, about 0.1 mm to 0.3 mm.

A plurality of metal layers 40 with a semi-circular shape in plan view are formed on the wiring patterns 30. These metal layers 40 are formed such that two metal layers 40 of which the straight lines of the semicircles face each other with the opening 30X interposed therebetween form a set (a pair). In other words, a pair of metal layers 40 are formed on different wiring patterns 30 and are formed so as to have an approximately circular shape in plan view as a whole. In addition, such a pair of metal layers 40 are formed in a matrix (in FIG. 2, 4×4) on the wiring patterns 30. Each of the metal layers 40 has a pad 40P to which a light emitting element 70 (refer to FIG. 3) is bonded. Further, as shown in FIG. 1B, each of the metal layers 40 is formed so as to cover the side surface of the wiring pattern 30 in the opening 30X. An example of the metal layer 40 may include a silver (Ag) layer, a nickel (Ni)/gold (Au) layer (a metal layer where an Ni layer and an Au layer are formed in this order), an Ni/Ag layer (a metal layer where an Ni layer and an Ag layer are formed in this order), an Ni/palladium (Pd)/Au layer (a metal layer where an Ni layer, a Pd layer, and an Au layer are formed in this order), or the like. Further, an example of the metal layer 40 may include an Ni/Pd/Ag layer (a metal layer where an Ni layer, a Pd layer, and an Ag layer are formed in this order), an Ni/Pd/Ag/Au layer (an Ni layer, a Pd layer, an Ag layer, and an Au layer are formed in this order), or the like. Furthermore, in a case where the metal layer 40 is, for example, an Ni/Au layer, the thickness of the Ni layer may be about 1 μm to 10 μm, and the thickness of the Au layer may be about 0.05 μm to 2 μm.

As shown in FIG. 2, a pair of metal layers 41 with an approximately circular shape in plan view are formed on the wiring patterns 30. These metal layers 41 are formed on the wiring patterns 30 to the outside of the metal layers 40. Specifically, a pair of metal layers 41 are formed on two wiring patterns 30 disposed at the outermost positions of the five wiring patterns 30 and are formed to the outside of the metal layers 40 formed on the two wiring patterns 30. Each of the metal layers 41 has an electrode terminal 41P which is supplied with power from an external device. An example of the metal layer 41 may include an Ag layer, an Ni/Au layer, an Ni/Ag layer, an Ni/Pd/Au layer, an Ni/Pd/Ag layer, an Ni/Pd/Ag/Au layer, or the like, in the same manner as the metal layer 40. In addition, in a case where the metal layer 41 is, for example, an Ni/Au layer, the thickness of the Ni layer may be about 1 μm to 10 μm, and the thickness of the Au layer may be about 0.05 μm to 2 μm.

As shown in FIG. 1B, the insulating layers 50 are formed so as to cover the first main surface 20A of the insulating layer 20 exposed from the wiring patterns 30 and the metal layers 40 and are formed so as to cover at least a portion of the side surfaces of the wiring patterns 30 and the metal layers 40. Specifically, the insulating layers 50 covering the first main surface 20A of the insulating layer 20 exposed from the openings 30X are formed so as to come into contact with at least a portion of the wiring patterns 30 or the metal layers 40. In addition, the insulating layers 50 covering the first main surface 20A of the insulating layer 20 formed in the outer circumferential region of the wiring substrate 1 are formed so as to come into contact with at least a portion of the side surfaces of the wiring patterns 30. The insulating layer 50 is formed so as to be an equal thickness to the wiring pattern 30 or thinner than the wiring pattern 30. Specifically, the thickness of the insulating layer 50 is preferably, for example, about 50% to 90% of the thickness of the wiring pattern 30 from the viewpoint of heat dissipation. As a material of the insulating layer 50, in the same manner as the insulating layer 20, for example, an insulating resin with high heat conductivity (for example, about 1 W/mK to 10 W/mK) may be used. Specifically, as a material of the insulating layer 50, for example, an insulating resin such as a polyimide resin or an epoxy resin, or a resin material where a filler such as silica or alumina is mixed with the resin may be used.

The insulating layer 60 is formed so as to cover the upper surfaces of the wiring patterns 30, the upper surfaces of the insulating layers 50, and a portion of the metal layers 40. The insulating layer 60 covers the upper surfaces of the wiring patterns 30 exposed from the metal layers 40, and covers the insulating layers 50 exposed from the metal layers 40 in the openings 30X, and the upper surfaces of the insulating layers 50 exposed from the wiring patterns 30 in the outer circumferential region of the wiring substrate 1.

An opening 60X which exposes a part of each metal layer 40 and an opening 60Y which exposes a part of each metal layer 41 are formed in the insulating layer 60. As shown in FIG. 1A, a planar shape of each opening 60X is formed, for example, in a semi-circular shape. Specifically, a planar shape of each opening 60X is formed so as to be smaller than a planar shape of each metal layer 40. For this reason, a part of the metal layer 40 is exposed from the opening 60X, and the exposed metal layer 40 functions as a pad 40P. In addition, a region with an approximately circular region (refer to the broken line circle) in plan view, including a pair of pads 40P corresponding to a pair of metal layers 40 becomes a mounting region CA for mounting a single light emitting element therein. In other words, the opening 60X is formed so as to expose the wiring patterns 30 and the metal layers 40 which become the mounting region CA. In addition, a planar shape of the opening 60Y is formed, for example, in a circular shape. Specifically, each opening 60Y is formed such that a planar shape thereof is smaller than a planar shape of the each metal layer 41. For this reason, a part of the metal layer 41 is exposed from the opening 60Y, and the exposed metal layer 41 functions as the electrode terminal 41P. The electrode terminal 41P is supplied with power from an external power source via wires and the like on a mounting board.

The insulating layer 60 has high reflectance. Specifically, the insulating layer 60 has reflectance of 50% or more (appropriately, 80% or more) between the wavelength 450 nm to 700 nm. The insulating layer 60 is also referred to as a white resist layer or a reflective layer. As a material of the insulating layer 60, for example, a white insulating resin may be used. As the white insulating resin, for example, a resin material where a filler or a pigment formed from white titanium oxide ($TiO_2$) or barium sulfate ($BaSO_4$) is contained in an epoxy resin, a silicone resin, or an organopolysiloxane resin may be used. The insulating layer 60 (white resist layer) covers the outermost surface of the wiring substrate 1, and thereby it is possible to reduce light amount loss of light emitting elements by increasing the reflectance of light from the light emitting elements mounted on the wiring substrate 1 as well as protecting the wiring patterns 30. In addition, the thickness (from the upper surface of the insulating layer 50 to the upper surface of the insulating layer 60) of the insulating layer 60 may be, for example, about 20 μm to 50 μm.

(Structure of Light Emitting Device)

Next, a structure of a light emitting device 2 will be described.

Figure 3A:
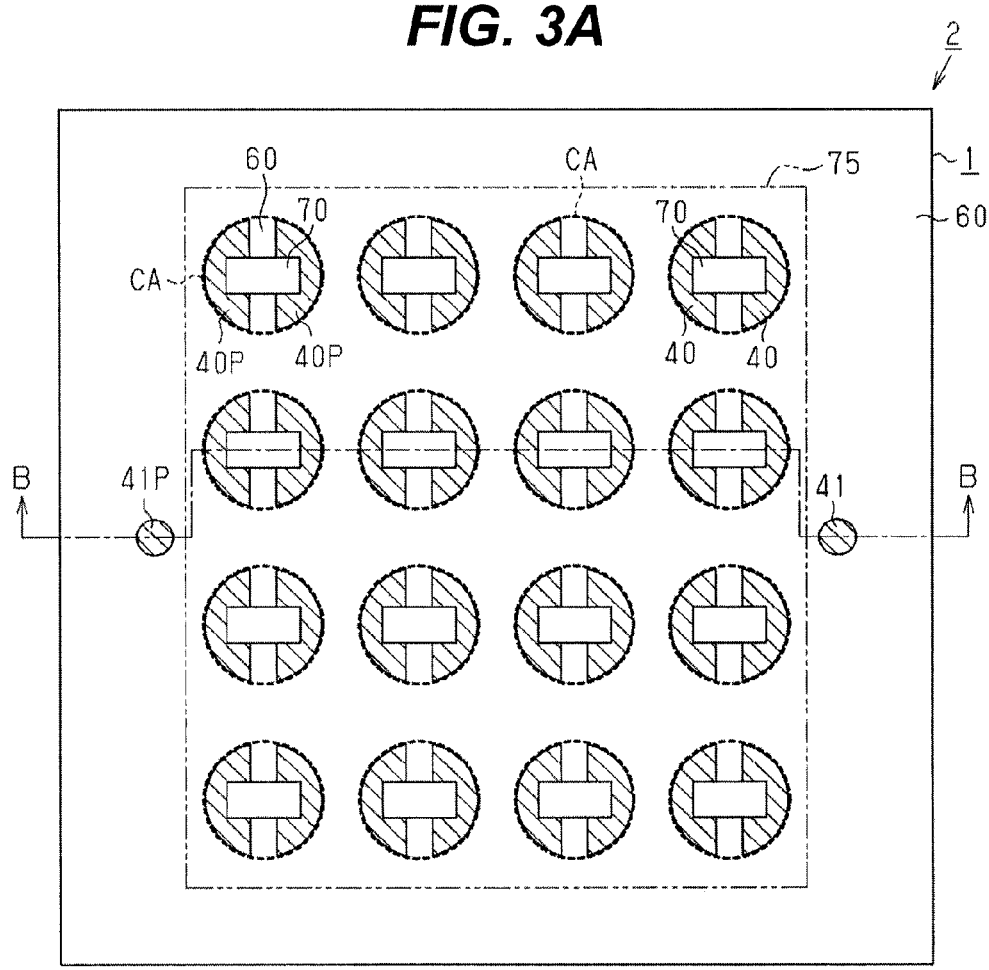
FIG. 3A is a schematic plan view illustrating a light emitting device according to the first embodiment.
Figure 3B:
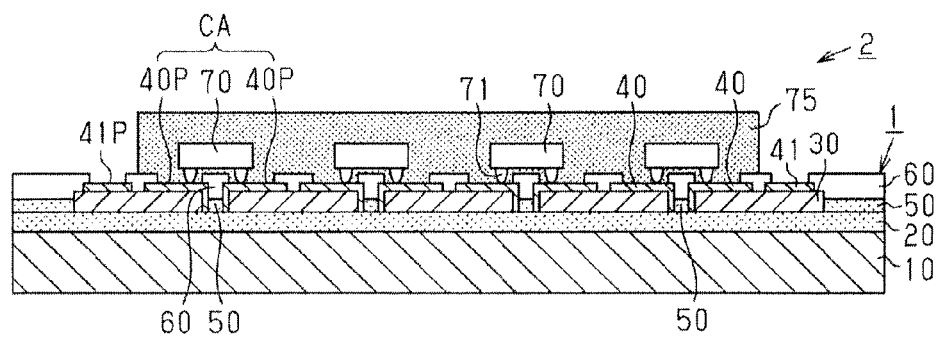
FIG. 3B is a schematic cross-sectional view taken along the line B-B of the light emitting device shown in FIG. 3A.

As shown in FIG. 3B, the light emitting device 2 includes the above-described wiring substrate 1, a plurality of (in FIG. 3A, sixteen) light emitting elements 70 mounted on the wiring substrate 1, and an encapsulating resin 75 which encapsulates the light emitting elements 70 and the like.

Each light emitting element 70 is mounted on a pair of pads 40P formed in each mounting region CA. Specifically, each light emitting element 70 is flip-chip mounted on two pads 40P formed on both sides of the insulating layer 60 so as to cross over the insulating layer 60 formed between the pair of pads 40P, that is, the insulating layer 60 formed in the opening 30X. More specifically, one bump 71 formed on one surface (the lower surface in FIG. 3B) of the light emitting element 70 is flip-chip bonded to one pad 40P of the two pads 40P, and the other bump 71 is flip-chip bonded to the other pad 40P. Thereby, each bump 71 of each light emitting element 70 is electrically connected to the wiring pattern 30 via the pad 40P (the metal layer 40). In addition, as shown in FIG. 3A, the light emitting elements 70 are arranged in a matrix (4×4 in FIG. 3A) on the wiring substrate 1. For this reason, in the light emitting device 2, between the pair of electrode terminals 41P, four light emitting elements 70 are connected in series, and four groups of the serially connected light emitting elements 70 are connected in parallel. In addition, the light emitting elements 70 are supplied with power from an external power source (not shown) via the metal layers 41 or the wiring patterns 30 and emit light. Further, a planar shape of the light emitting element 70 is formed, for example, in a rectangular shape, and the size thereof may be, for example, about 0.3 mm$^2$ to 0.5 mm$^2$. Furthermore, the height of the bump 71 may be, for example, about 30 μm to 100 μm.

As the light emitting element 70, for example, a light emitting diode (LED) or a vertical cavity surface emitting laser (VCSEL) may be used. As the bump 71, for example, a gold bump or a solder bump may be used. As a material of the solder bump, for example, an alloy including lead (Pb), an alloy of tin (Sn) and Au, an alloy of Sn and Cu, an alloy of Sn and Ag, an alloy of Sn, Ag and Cu, or the like may be used.

As shown in FIG. 3B, the encapsulating resin 75 is provided on the upper surface of the wiring substrate 1 so as to encapsulate the light emitting elements 70, the bumps 71, and the like. In addition, the electrode terminals 41P are not encapsulated with the encapsulating resin 75. As a material of the encapsulating resin 75, for example, a resin material where a fluorescent substance is contained in a silicone resin may be used. The resin material containing the fluorescent substance is formed on the light emitting elements 70, thus a mixed color of emission of the light emitting element 70 and emission of the fluorescent substance can be used, and thereby it is possible to control various emission colors of the light emitting device 2.

(Operation)

The insulating layers 50 are formed so as to come into contact with a portion of side surfaces of the wiring patterns 30 and the metal layers 40. For this reason, as compared with a case where the insulating layers 50 are not formed, that is, only the lower surfaces of the wiring patterns 30 come into contact with the insulating layer 20, the contact area between the wiring patterns 30 and the metal layers 40, and the insulating layers 20 and 50 increase as much as the side surfaces of the wiring patterns 30 and the metal layers 40 come into contact with the insulating layers 50. Thereby, a heat conduction amount from the wiring patterns 30 and the metal layers 40 to the insulating layers 20 and 50 increases. Therefore, heat generated by the light emitting element 70 is conducted to the heat sink 10 with efficiency.

(Manufacturing Method of Wiring Substrate)

Next, a manufacturing method of the wiring substrate 1 will be described with reference to FIGS. 4 to 8.

First, in order to manufacture the wiring substrate 1, as shown in FIG. 4, a multi-piece substrate (hereinafter, also simply referred to as a "substrate") 10A is prepared. The substrate 10A has a plurality of (in FIG. 4, three) partitions where wiring substrate forming regions C1 which are regions in which the wiring substrate 1 is formed are formed in a matrix (3×3 in FIG. 4). The substrate 10A is cut along the cutting lines D1 using a dicing blade or the like after a structure corresponding to the wiring substrate 1 is formed in the wiring substrate forming region C1. Thereby, the structure corresponding to the wiring substrate 1 is generated as a unit piece, and thereby a plurality of wiring substrates 1 are manufactured. At this time, in each wiring substrate 1, the substrate 10A becomes the heat sink 10 shown in FIG. 1. For this reason, as a material of the substrate 10A, in the same manner as the heat sink 10, a metal with favorable heat conductivity such as, for example, copper, aluminum, or iron, or an alloy including at least one of these metals may be used. In addition, for convenience of description, in FIGS. 5 to 8 described later, a structure of a single wiring substrate forming region C1 is shown.

Figure 5A:
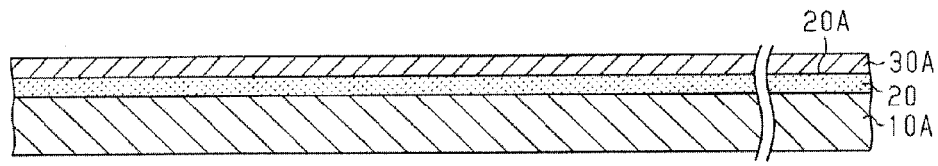
FIGS. 5A to 5C are schematic cross-sectional views illustrating manufacturing steps of the wiring substrate according to the first embodiment.

Next, in the step shown in FIG. 5A, the insulating layer 20 is formed so as to cover the entire upper surface of the substrate 10A, and a copper foil 30A is formed so as to cover the entire first main surface 20A of the insulating layer 20. For example, a single-side copper-clad substrate having the copper foil 30A formed on a single surface of the insulating layer 20 (insulating substrate) is adhered to the substrate 10A, thereby forming the insulating layer 20 and the copper foil 30A on the substrate 10A. In addition, for example, an insulating resin film with a copper foil may be formed on the substrate 10A, thereby forming the insulating layer 20 and the copper foil 30A on the substrate 10A.

Figure 5B:
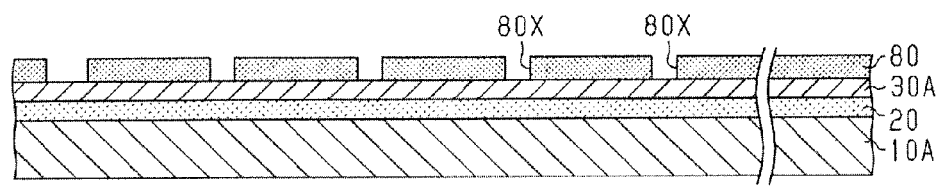

Next, in the step shown in FIG. 5B, a resist layer 80 having an opening 80X at a predetermined location is formed on the upper surface of the copper foil 30A. The resist layer 80 is formed so as to cover the copper foil 30A at portion corresponding to the necessary wiring patterns 30, a feed line 31 for plating power supply, and connection portions 32 (refers to FIGS. 5C and 5D). As a material of the resist layer 80, an etching resistant material may be used. Specifically, as a material of the resist layer 80, a photosensitive dry film resist, a liquid photoresist (for example, a dry film resist or a liquid resist of a Novolac resin, an acryl resin, or the like), and the like may be used. For example, in a case of using the photosensitive dry film resist, a dry film is formed on the upper surface of the copper foil 30A through thermocompression, and the dry film is patterned through exposure and development, thereby forming the resist layer 80. Further, in a case where the liquid photoresist is used as well, the resist layer 80 may be formed through the same steps.

Figure 5C:
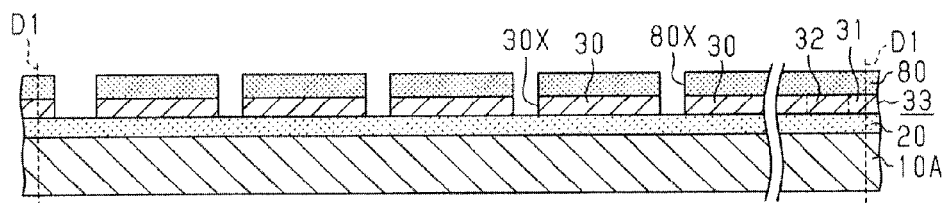
Figure 5D:
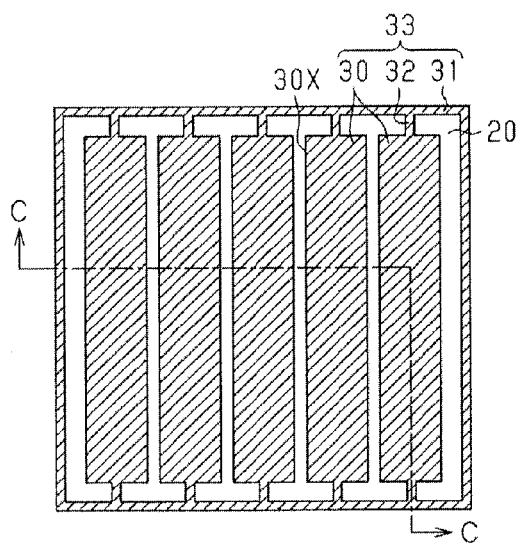

Next, in the step shown in FIG. 5C, the copper foil 30A is etched using the resist layer 80 shown in FIG. 5B as an etching mask, thereby patterning the copper foil 30A in a predetermined shape. Thereby, as shown in FIG. 5D, the necessary wiring patterns 30, the feed line (bus line) 31, and the connection portions 32 are formed on the first main surface 20A of the insulating layer 20. Specifically, a plurality of strip-shaped wiring patterns 30 arranged in parallel, the feed line 31 formed in a frame shape, and the connection portions 32 which electrically connect the feed line 31 and the wiring patterns 30 to each other, are formed. Thereby, all the wiring patterns 30 are electrically connected to the feed line 31 via the connection portions 32. In addition, the groove-shaped opening 30X is formed between the wiring patterns 30 through the etching. In this step, as an etchant, for example, a ferric chloride solution can be used, and thus the patterning can be performed from the upper surface side of the substrate 10A through spray etching. Further, in the following description, the wiring patterns 30, the feed line 31, and the connection portions 32 are also collectively referred to as wiring layers 33. FIG. 5D shows a state where the resist layer 80 shown in FIG. 5C is removed by, for example, an alkaline stripping agent after the patterning of the copper foil 30A is completed.

Next, in the step shown in FIG. 6A, a resist layer 81 having openings 81X and 81Y at predetermined locations is formed on the wiring patterns 30. The opening 81X is formed so as to expose a portion of the wiring pattern 30 corresponding to a region where the metal layer 40 is formed. In addition, the opening 81Y is formed so as to expose a portion of the wiring pattern 30 corresponding to a region where the metal layer 41 is formed. Further, the feed line 31 and the connection portions 32 are covered with the resist layer 81. As a material of the resist layer 81, a plating resistant material may be used. Specifically, as a material of the resist layer 81, a photosensitive dry film resist, a liquid photoresist (for example, a dry film resist or a liquid resist of a Novolac resin, an acryl resin, or the like), or the like may be used.

Next, in the step shown in FIG. 6B, electrolytic plating where the wiring layers 33 are used as plating feed layers is performed on the surfaces (the upper surfaces and the side surfaces) of the wiring patterns 30 by using the resist layer 81 as a plating mask. Specifically, the electrolytic plating is performed on the upper surfaces and the side surfaces of the wiring patterns 30 exposed from the openings 81X of the resist layer 81, thereby forming the metal layers 40. The metal layers 40 are formed so as to cover the upper surfaces and the side surfaces of the wiring patterns 30 exposed from the opening 81X. In addition, the electrolytic plating is performed on the upper surfaces of the wiring patterns 30 exposed from the opening 81Y of the resist layer 81, thereby forming the metal layers 41 on the wiring patterns 30. The metal layers 41 are formed so as to cover the upper surfaces of the wiring patterns 30 exposed from the opening 81Y. In addition, for example, in a case where the metal layers 40 and 41 are Ni/Au layers, an Ni layer and an Au layer are formed in order on the surfaces of the wiring patterns 30 exposed from the openings 81X and 81Y of the resist layer 81 through the electrolytic plating method.

Next, in the step shown in FIG. 6C, the resist layer 81 shown in FIG. 6B is removed by, for example, an alkaline stripping agent. Thereby, as shown in FIG. 6D, a plurality of metal layers 40 with an approximately semi-circular shape in plan view are formed and a plurality of metal layers 41 with an approximately circular shape in plan view are formed on the wiring patterns 30.

Next, in the step shown in FIGS. 7A and 7B, a resist layer 82 is formed on the insulating layer 20 and the wiring patterns 30 so as to cover the wiring patterns 30. The resist layer 82 is formed so as to expose the feed line 31 and the connection portions 32 and is formed so as to expose the insulating layer 20 which is formed to the outside of the wiring patterns 30. As a material of the resist layer 82, an etching resistant material may be used. Specifically, as a material of the resist layer 82, a photosensitive dry film resist, a liquid photoresist (for example, a dry film resist or a liquid resist of a Novolac resin, an acryl resin, or the like), or the like may be used.

Figure 8A:
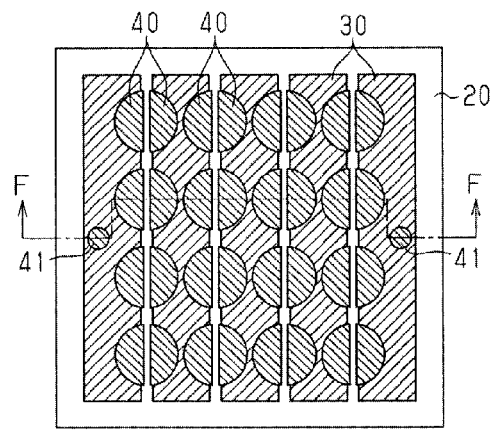
FIG. 8A is a schematic plan view illustrating the manufacturing step of the wiring substrate according to the first embodiment.

Next, in the step shown in FIGS. 7C and 7D, the wiring layers 33 are etched using the resist layer 82 as an etching mask, thereby removing the feed line 31 and the connection portions 32 shown in FIG. 7A. Thereby, as shown in FIG. 8A, a plurality of wiring patterns 30 are electrically separated from each other. In addition, FIG. 8A shows a state where the resist layer 82 shown in FIG. 7D is removed by, for example, an alkaline stripping agent after the etching.

Figure 8B:
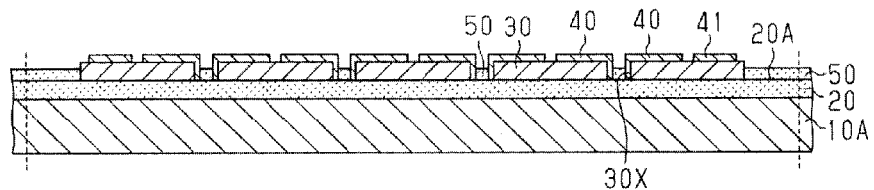
FIGS. 8B to 8D are schematic cross-sectional views illustrating the manufacturing steps of the wiring substrate taken along the line F-F position of FIG. 8A.

Next, in the step shown in FIG. 8B, the insulating layers 50 are formed on the insulating layer 20 so as to cover the first main surface 20A of the insulating layer 20. The insulating layers 50 are formed so as to cover a portion of the side surfaces of the respective wiring patterns 30 (a portion of the side surfaces of the metal layers 40 in a case where the side surfaces of the wiring patterns 30 are covered by the metal layers 40). The insulating layer 50 is formed such that the upper surface of thereof is lower than the upper surface of the wiring pattern 30. In addition, the insulating layers 50 may be formed according to, for example, a screen printing method using a resin paste. The insulating layers 50 may be formed by applying a liquid resin using a dispenser. Further, in a case where a photosensitive insulating resin is used as a material of the insulating layers 50, the insulating layers 50 may be formed through photolithography. Next, in the step shown in FIG. 8B, the insulating layers 50 are cured by performing a heat curing treatment in an atmosphere of a temperature of about 150° C.

Figure 8C:
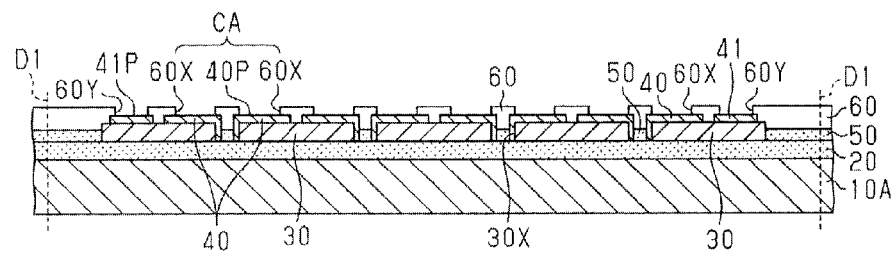

Next, in the step shown in FIG. 8C, the insulating layer 60 having the openings 60X and 60Y is formed on the wiring patterns 30, the metal layers 40 and 41, and the insulating layers 50. The opening 60X is formed so as to expose the metal layers 40 which will become the mounting region CA. In addition, the opening 60Y is formed so as to expose a portion of the metal layers 41 as the electrode terminals 41P. The insulating layer 60 may be formed according to, for example, a screen printing method using a resin paste. Further, in a case where a photosensitive insulating resin is used as a material of the insulating layer 60, a resist layer which will become the insulating layer 60 is formed so as to cover the upper surfaces of the wiring patterns 30, the metal layers 40 and the insulating layers 50, then the resist layer is exposed and developed through a photolithography method so as to form the openings 60X and 60Y, thereby forming the insulating layer 60. Next, in the step shown in FIG. 8C, the insulating layer 60 is cured by performing a heat curing treatment in a temperature atmosphere of about 150° C. In addition, the insulating layer 60 and the insulating layers 50 may be cured together through the heat curing treatment in this step.

By forming the insulating layer 60, a portion of the metal layers 40 are exposed from the opening 60X as the pads 40P. For this reason, it is not necessary to perform electrolytic plating or the like on the wiring patterns 30 in order to improve contact characteristics after the insulating layer 60 is formed. Thereby, it is possible to suppress deterioration in a plating solution which is used to form the metal layers 40. Specifically, in a case where plating (electrolytic plating or electroless plating) is performed on the wiring patterns 30 exposed from the opening 60X after forming the insulating layer 60, a resin material or the like included in the insulating layer 60 is eluted with respect to a plating solution used at that time. For this reason, there is a problem in that the plating solution deteriorates and thus the solution lifetime is shortened. In contrast, according to the manufacturing method of the present embodiment, when the electrolytic plating is performed, the insulating layer 60 is not formed, and thus it is possible to prevent the above-described problem in advance. That is, according to the manufacturing method of the present embodiment, it is possible to suppress a plating solution from deteriorating and to thereby suppress the solution lifetime of the plating solution from being shortened.

Figure 8D:
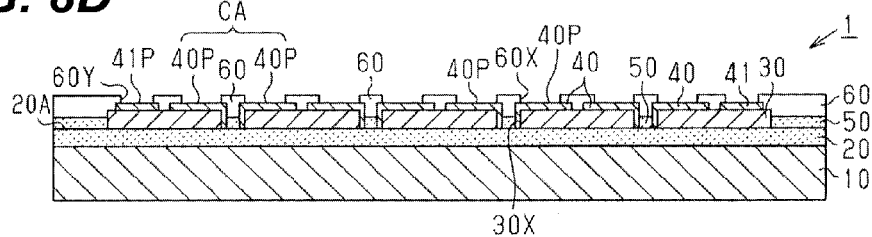

Subsequently, in the step shown in FIG. 8C, the structure shown in the same figure is cut along the cutting lines D1. Thereby, as shown in FIG. 8D, the wiring substrate 1 is generated as a unit piece, thereby manufacturing a plurality of wiring substrates 1.

(Manufacturing Method of Light Emitting Device)

Next, a manufacturing method of the light emitting device 2 will be described with reference to FIG. 9.

Figure 9A:
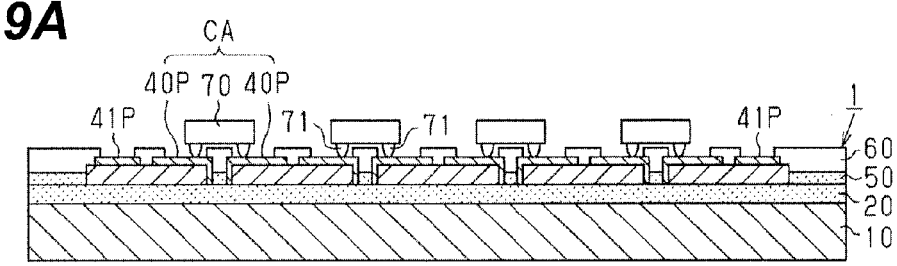

In the step shown in FIG. 9A, the light emitting element 70 is mounted on the pads 40P formed in each mounting region CA of the wiring substrate 1. Specifically, the bumps 71 of the light emitting element 70 are flip-chip bonded to the respective surfaces of the adjacent pads 40P. For example, in a case where the bumps 71 are gold bumps, the bumps 71 are fixed onto the pads 40P through ultrasonic bonding.

Figure 9B:
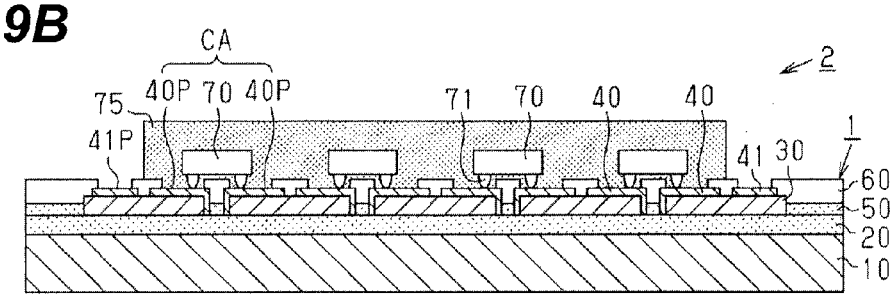

Next, in the step shown in FIG. 9B, the encapsulating resin 75 which encapsulates a plurality of light emitting elements 70 and the bumps 71 mounted on the wiring substrate 1 is formed. For example, in a case where a thermosetting resin is used as the encapsulating resin 75, the structure shown in FIG. 9A is accommodated in a mold, and pressure (for example, 5 MPa to 10 Mpa) is applied to the inside of the mold, thereby introducing a fluidized resin thereinto. Thereafter, the resin is heated at, for example, about 180° C. so as to be cured, thereby forming the encapsulating resin 75. In addition, the encapsulating resin 75 may be formed by potting a liquid resin. Through the above-described manufacturing steps, the light emitting device 2 shown in FIG. 3 is manufactured.

(Effects)

According to the above-described present embodiment, the following effects can be achieved.

(1) The insulating layers 50 are formed so as to come into contact with a portion of the side surfaces of the wiring patterns 30 and the metal layers 40. For this reason, as compared with a case where the insulating layers 50 are not formed, that is, only the lower surfaces of the wiring patterns 30 come into contact with the insulating layer 20, the contact area between the wiring patterns 30 and the metal layers 40, and the insulating layers 20 and 50 increases as much as the side surfaces of the wiring patterns 30 and the metal layers 40 come into contact with the insulating layers 50. Thereby, a heat conduction amount from the wiring patterns 30 and the metal layers 40 to the insulating layers 20 and 50 increases, and, therefore, heat generated by the light emitting element 70 is conducted to the heat sink 10 with efficiency. Therefore, even in a case where the insulating layer 20 with low heat conductivity is interposed between the wiring patterns 30 and the heat sink 10, it is possible to improve heat dissipation performance of the light emitting device 2. As a result, since an increase in temperature of the light emitting element 70 can be suppressed, it is possible to appropriately suppress reduction in emission efficiency of the light emitting element 70.

(2) The insulating layers 20 and 50 which come into contact with a portion of the wiring patterns 30 and the metal layers 40 are formed using a material with high heat conductivity. Thereby, a heat conduction amount from the wiring patterns 30 and the metal layers 40 to the insulating layers 20 and 50 further increases, and, therefore, heat generated by the light emitting element 70 is conducted to the heat sink 10 with efficiency. Therefore, it is possible to improve heat dissipation performance of the light emitting device 2.

(3) After the metal layers 40 are formed on the wiring patterns 30 using the electrolytic plating method, the insulating layer 60 which covers a portion of the wiring patterns 30 and the metal layers 40 is formed. In this case, since the insulating layer 60 is not formed when the metal layers 40 are formed using the electrolytic plating method, it is possible to prevent in advance deterioration in a plating solution due to the presence of the insulating layer 60. Thereby, it is possible to lengthen the solution lifetime of the plating solution and to thereby continuously use the plating solution. As a result, it is possible to contribute to cost reduction.

(4) The metal layers 40 are formed using the electrolytic plating method. Thereby, it is possible to further reduce manufacturing costs than in a case of forming the metal layers 40 using an electroless plating method.

(5) The insulating layers 50 which come into contact with a portion of the side surfaces of the wiring patterns 30 and the metal layers 40 are formed by applying a liquid resin using screen printing or a dispenser. For this reason, the insulating layers 50 can be easily formed.

Modified Examples of First Embodiment

In addition, the above-described first embodiment may be performed in the following aspects by appropriately modifying the embodiment.

Figure 10A:
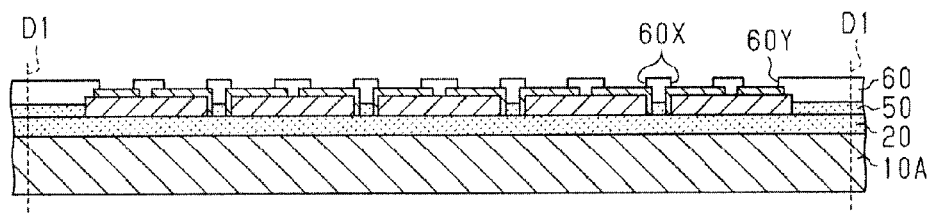
Figure 10B:
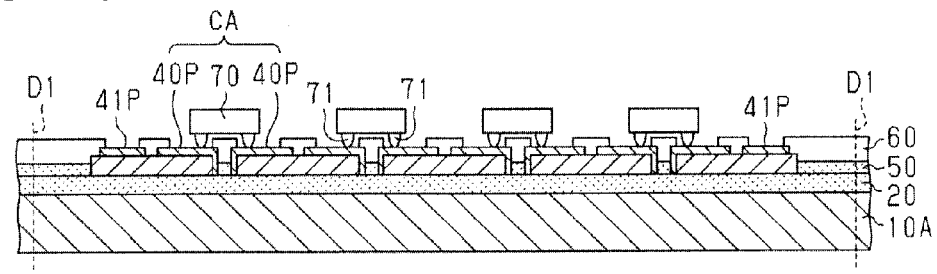
Figure 10C:
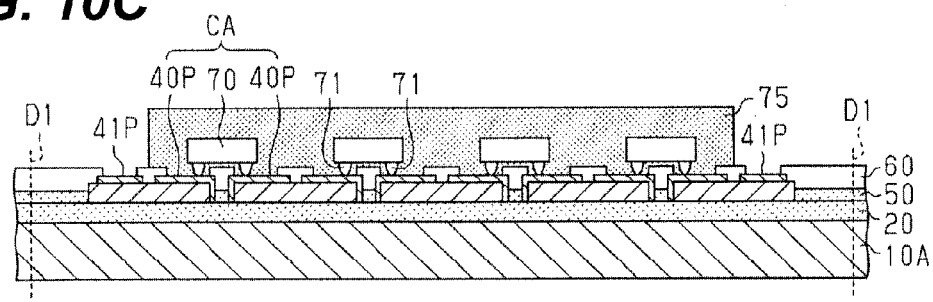
Figure 10D:
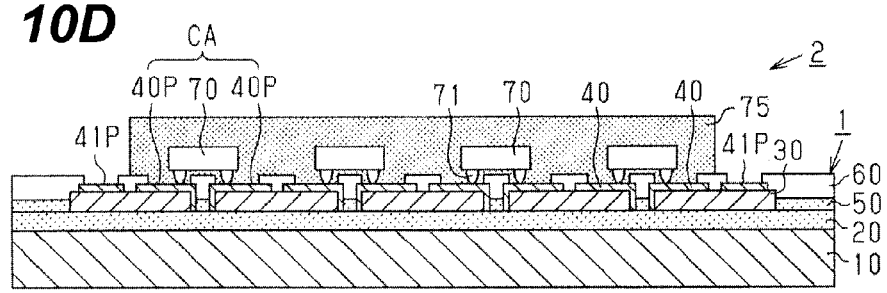

In the first embodiment, the wiring substrate 1 is generated as a unit piece, and then the light emitting element 70 is mounted on the pads 40P of the wiring substrate 1. The present invention is not limited thereto, and, as shown in FIG. 10, the light emitting element 70 may be mounted on the pads 40P before the wiring substrate 1 is generated as a unit piece, and then cutting may be performed along the cutting lines D1, thereby obtaining each light emitting device 2. Specifically, as shown in FIG. 10A, after forming the insulating layer 60, the light emitting element 70 is mounted on the pads 40P as shown in FIG. 10B without cutting along the cutting lines D1. Next, as shown in FIG. 10C, after the light emitting elements 70 are encapsulated with the encapsulating resin 75, cutting may be performed along the cutting lines D1, thereby obtaining each light emitting device 2 as shown in FIG. 10D. In addition, the encapsulating resin 75 may be formed for the respective partitions where the wiring substrate forming regions C1 are formed in a matrix (in FIG. 4, 3×3) using a collective molding method, or may be formed for each wiring substrate forming region C1 using a separate molding method.

In the first embodiment, after the metal layers 40 are formed so as to cover a portion of the wiring patterns 30, the insulating layers 50 are formed so as to cover a portion of the wiring patterns 30 and the metal layers 40. The present invention is not limited thereto, and, for example, the insulating layers 50 may be formed so as to cover the side surfaces of the wiring patterns 30 before forming the metal layers 40, and, thereafter, the metal layers 40 may be formed so as to cover a portion of the surfaces (the upper surfaces and the side surfaces) of the wiring patterns 30. In this case, since the metal layers 40 which cover the side surfaces of the wiring patterns 30 in the openings 30X are formed on the upper surfaces of the insulating layers 50, the insulating layers 50 come into contact with the side surfaces of the wiring patterns 30 and also come into contact with the lower surfaces of the metal layers 40. For this reason, in the mounting regions CA, the contact area between the insulating layers 50, and the wiring patterns 30 and the metal layers 40 increases as much as contact with the lower surfaces of the metal layers 40. Thereby, a heat conduction amount from the wiring patterns 30 and the metal layers 40 to the insulating layers 20 and 50 increases, and, therefore, heat generated by the light emitting element 70 is conducted to the heat sink 10 with efficiency.

Figure 11A:
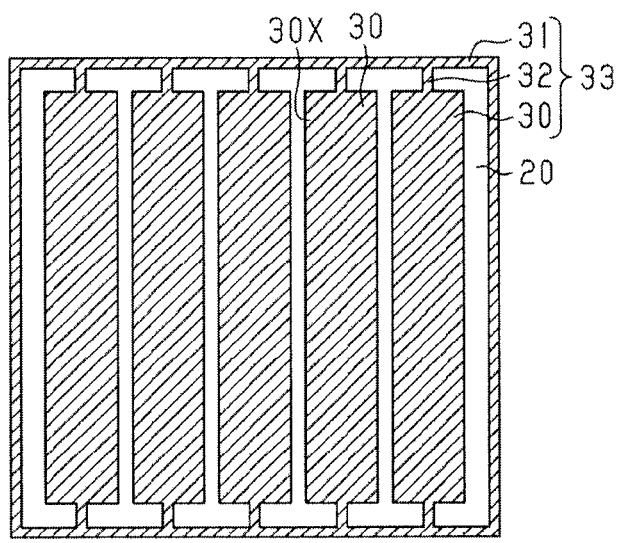
FIGS. 11A to 11C are schematic plan views illustrating manufacturing steps of the wiring substrate according to the modified example.
Figure 11B:
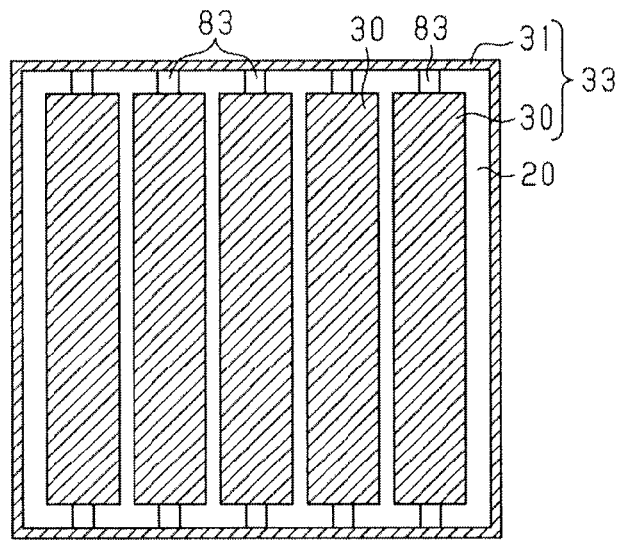

In the first embodiment, after the metal layers 40 are formed so as to cover a portion of the wiring patterns 30, the wiring patterns 30 and the metal layers 40 are entirely masked, and the feed line 31 and the connection portions 32 are removed through etching. The present invention is not limited thereto, and, for example, modified manufacturing steps shown in FIGS. 11 and 12 may be employed. Specifically, as shown in FIG. 11A, the wiring patterns 30, the feed line 31, and the connection portions 32 are formed on the insulating layer 20 in the same manner as the previous step shown in FIG. 5. Next, in the step shown in FIG. 11B, a resist layer 83 is formed so as to cover only the connection portions 32 of the wiring layers 33 on the connection portions 32. As a material of the resist layer 83, a plating resistant material may be used. Specifically, as a material of the resist layer 83, a photosensitive dry film resist, a liquid photoresist (for example, a dry film resist or a liquid resist of a Novolac resin, an acryl resin, or the like), or the like may be used.

Next, electrolytic plating where the wiring layers 33 are used as plating feed layers is performed on the surfaces (the upper surfaces and the side surfaces) of the wiring patterns 30 and the feed line 31 by using the resist layer 83 as a plating mask. Thereby, as shown in FIG. 11C, metal layers 42 are formed so as to cover the entire surfaces of the wiring patterns 30, and a metal layer 43 is formed so as to cover the entire surface of the feed line 31.

Figure 11C:
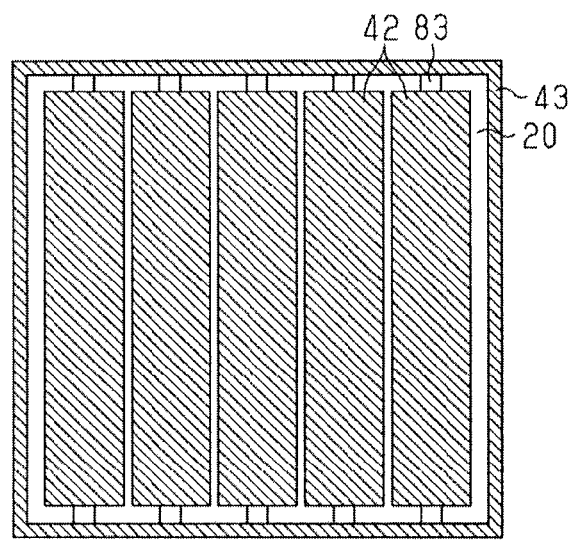
Figure 12A:
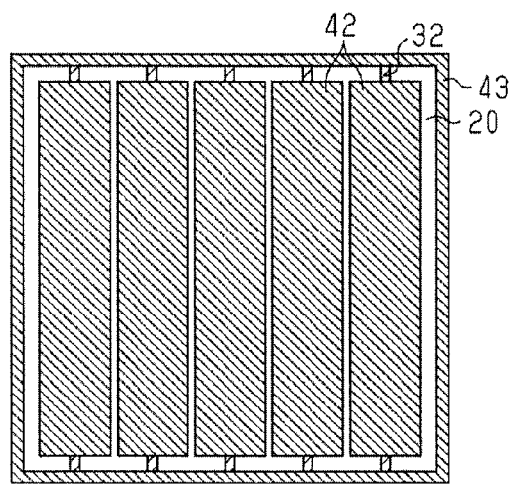
FIGS. 12A and 12B are schematic plan views illustrating manufacturing steps of a wiring substrate according to the modified example.
Figure 12B:
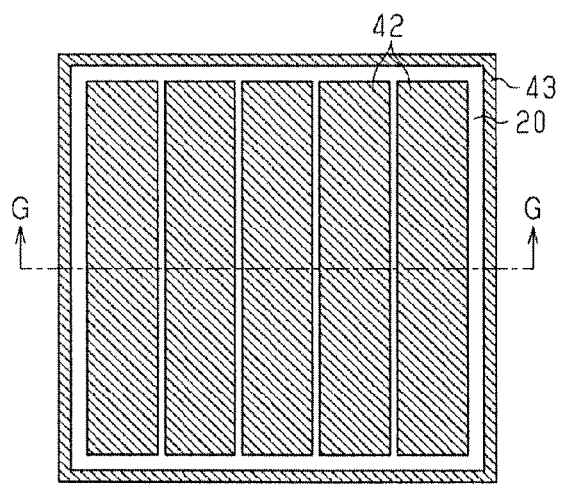
Figure 12C:
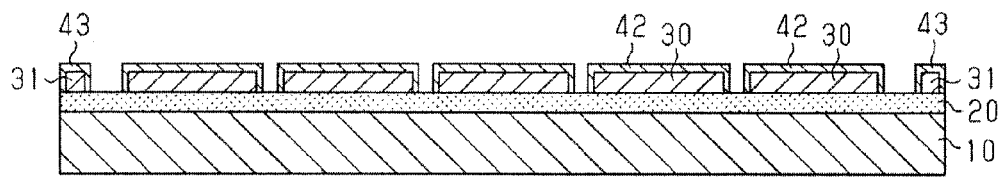
FIG. 12C is a schematic cross-sectional view illustrating the manufacturing step of the wiring substrate taken along the line G-G position of FIG. 12B.

Next, in the step shown in FIG. 12A, the resist layer 83 shown in FIG. 11C is removed by, for example, an alkaline stripping agent. Thereafter, in the step shown in FIG. 12B, the connection portions 32 are selectively removed with respect to the metal layers 42 and 43. For example, in a case where the metal layers 42 and 43 are Ni/Au layers, the connection portions 32 made of copper can be selectively removed with respect to the metal layers 42 and 43 through wet etching using a ferric chloride solution, a cupric chloride solution, an ammonium persulfate solution, or the like. Thereby, as shown in FIG. 12C, the wiring patterns 30 of which the surfaces (the upper surfaces and the side surfaces) are covered by the metal layers 42 and the feed line 31 of which the surface is covered by the metal layer 43 are not removed and are left.

With this structure, since the feed line 31 and the metal layer 43 with the relatively high rigidity are formed in the outer circumferential region of the wiring substrate 1, it is possible to increase the rigidity of the wiring substrate 1. Therefore, it is possible to appropriately suppress the wiring substrate 1 from being bent or deformed due to thermal contraction. In other words, with the structure, the feed line 31 and the metal layer 43 can be used as a reinforcement layer. In addition, even if the feed line 31 and the metal layer 43 covering the feed line 31 are left in the wiring substrate 1 generated as a unit piece, the feed line 31 is separated from a plurality of wiring patterns 30, and thus there is no problem in terms of characteristics of the wiring substrate 1.

Alternatively, in the previous step shown in FIG. 11B, the resist layer 83 may be formed so as to cover the feed line 31 and the connection portions 32 of the wiring layers 33. Thereby, even if the metal layers 42 are formed only on the entire surfaces of the wiring patterns 30 of the wiring layers 33, the feed line 31 and the connection portions 32 are selectively removed through the step shown in FIG. 12B.

Although, in the first embodiment, the metal layers 40 are formed using the electrolytic plating method, the present invention is not limited thereto, and, for example, the metal layers 40 may be formed using an electroless plating method. In this case, when the copper foil 30A is patterned, forming of the feed line 31 and the connection portions 32 may be omitted. For this reason, the steps (the steps shown in FIGS. 7A to 7D) of removing the feed line 31 and the connection portions 32 can be also omitted.

In the light emitting element 70 of the first embodiment, one bump 71 is flip-chip bonded to one pad 40P of the two pads 40P formed in each mounting region CA, and the other bump 71 is flip-chip bonded to the other pad 40P. The present invention is not limited thereto, and, for example, a plurality of bumps 71 may be flip-chip bonded to one pad 40P, and a plurality of bumps 71 may be flip-chip bonded to the other pad 40P.

Here, in a case where a single bump 71 is bonded to a single pad 40P, a connection location on each pad 40P is only one, and thus there is concern that the light emitting element 70 mounted on the wiring substrate 1 may be tilted. In contrast, in the structure according to the modified example, a plurality of bumps 71 are bonded to a single pad 40P, and thus there are a plurality of connection locations on each pad 40P. Thereby, it is possible to stably mount the light emitting element 70 on the wiring substrate 1.

Figure 13:
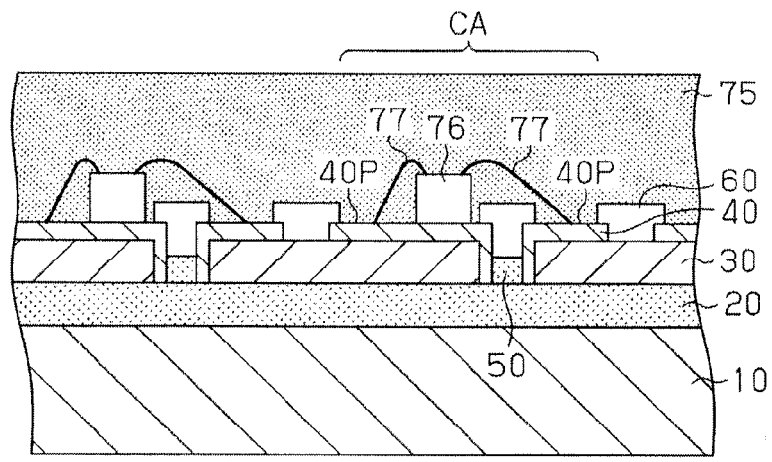
FIG. 13 is a schematic cross-sectional view illustrating a light emitting device according to a modified example.

In the first embodiment, the light emitting element 70 is flip-chip mounted on the pads 40P formed on the upper surface of the wiring substrate 1. The present invention is not limited thereto, and, for example, as shown in FIG. 13, a light emitting element 76 may be mounted on the pads 40P in a wire bonding manner. In this case, the light emitting element 76 is bonded onto one pad 40P formed in each mounting region CA via an adhesive (not shown). In addition, in the light emitting element 76, one electrode (not shown) is electrically connected to one pad 40P in the mounting region CA via a bonding wire 77, and the other electrode (not shown) is electrically connected to the other pad 40P in the mounting region CA via a bonding wire 77.

Figure 14:
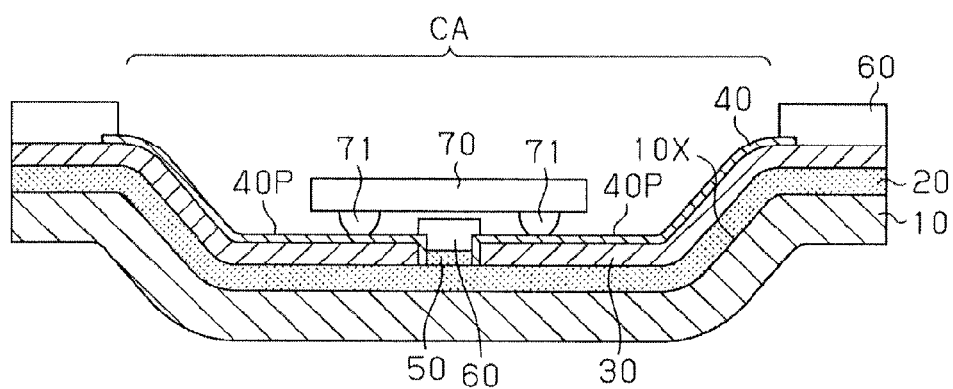
FIG. 14 is a schematic cross-sectional view illustrating a light emitting device according to a modified example.

As shown in FIG. 14, a recessed portion 10X may be formed in the mounting region CA of the wiring substrate 1, and the light emitting element 70 may be mounted in the recessed portion 10X. In this case, the insulating layer 20 and the wiring patterns 30 are formed in the recessed portion 10X, the metal layers 40 are formed on the surfaces of the wiring patterns 30, and the insulating layers 50 are formed on the insulating layer 20 so as to cover a portion of the side surfaces of the metal layers 40. In addition, the light emitting element 70 is mounted on the metal layers 40 (pads 40P) formed on the bottom of the recessed portion 10X. Further, in FIG. 14, the light emitting element 70 is flip-chip mounted; however, the light emitting element may be mounted in a wire bonding manner.

In the first embodiment, a plurality of light emitting elements 70 mounted on the wiring substrate 1 are collectively encapsulated with the encapsulating resin 75. The present invention is not limited thereto, and the light emitting element 70 mounted in each mounting region CA may be encapsulated separately with an encapsulating resin.

In the first embodiment, after the metal layers 40 and 41 are formed, the insulating layer 60 is formed. The present invention is not limited thereto, and, for example, after the insulating layer 60 having the openings 60X and 60Y is formed, the metal layers 40 and 41 may be respectively formed on the wiring patterns 30 exposed from the openings 60X and 60Y. Specifically, after the insulating layer 60 is formed, the electrolytic plating may be performed on the wiring patterns 30 exposed from the openings 60X and 60Y, thereby forming the metal layers 40 and 41.

A planar shape of the opening 60X or the metal layer 40 in the first embodiment is not limited to a semi-circular shape, and may be, for example, a polygonal shape such as a rectangular shape or a pentagonal shape, a circular shape, an elliptical shape, or a semi-elliptical shape.

A planar shape of the opening 60Y or the metal layer 41 in the first embodiment is not limited to a circular shape, and may be, for example, a polygonal shape such as a rectangular shape or a pentagonal shape, a semi-circular shape, an elliptical shape, or a semi-elliptical shape.

Second Embodiment

Hereinafter, the second embodiment will be described with reference to FIGS. 15 and 16. In a wiring substrate 1 (refer to FIG. 16D) according to this embodiment, an embedded structure of the wiring pattern 30 in an insulating layer is different from that in the first embodiment and the modified examples thereof. The description will now be made mainly based on differences from the first embodiment and the modified examples. In addition, the same members as the members shown in FIGS. 1 to 14 are given the same reference numerals, and a detailed description of each element will be omitted.

A manufacturing method of the wiring substrate 1A will be described with reference to FIGS. 15 and 16.

Figure 15A:
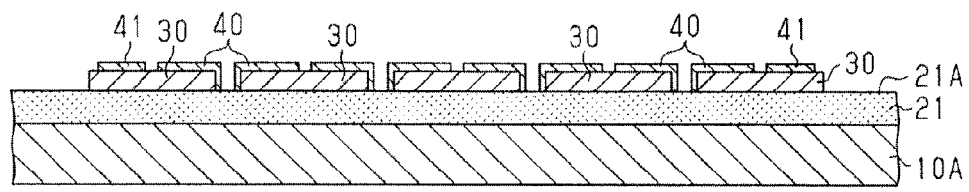

First, in the step shown in FIG. 15A, through the same manufacturing steps as the previous steps shown in FIGS. 5A to 8A, the wiring patterns 30 are formed on the first main surface 21A of the insulating layer 21 formed on the upper surface of the substrate 10A, and the metal layers 40 and 41 are formed so as to cover a portion of the surfaces (the upper surfaces and the side surfaces) of the wiring patterns 30. As a material of the insulating layer 21 at this time, for example, an insulating resin such as a thermosetting polyimide resin or epoxy resin, or a resin material where a filler such as silica or alumina is mixed with the resin may be used. The insulating layer 21 has a function of insulating the heat sink 10 from the wiring patterns 30, and a function of adhering the heat sink 10 to the wiring patterns 30. The thickness of the insulating layer 21 may be, for example, about 50 µm to 130 µm. Further, in a case where the insulating layer 21 has high insulation properties, the insulating layer 21 is preferably formed thinly from the viewpoint of heat dissipation.

Figure 15B:
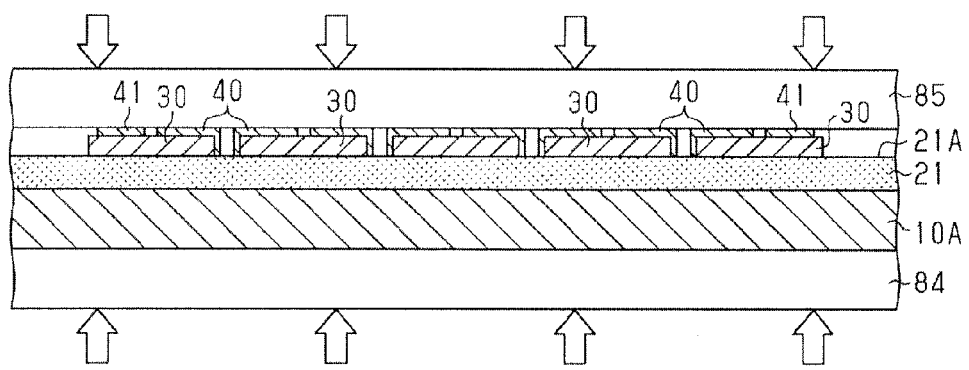
Figure 15C:
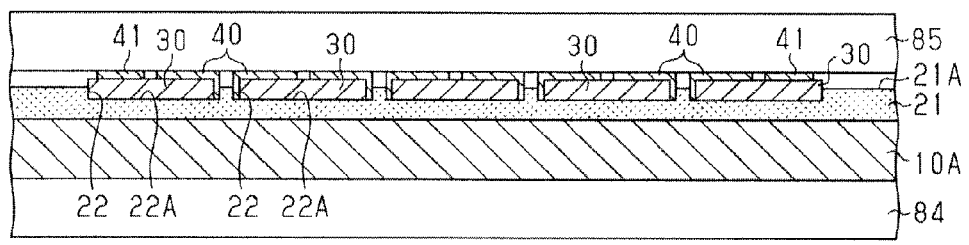

Next, in the step shown in FIG. 15B, the structure shown in FIG. 15A is disposed between a lower pressing jig 84 and an upper pressing jig 85, and is heated and pressed (heating press) from both the sides thereof at the temperature of about 150° C. to 200° C. At this time, the insulating layer 21 is heated at temperature higher than the glass-transition temperature (Tg), the insulating layer 21 is softened. For this reason, as shown in FIG. 15C, the wiring patterns 30 and the metal layers 40 formed on the insulating layer 21 are pushed in the insulating layer 21 by the pressure from the pressing jigs 84 and 85. In this step, the wiring patterns 30 and the metal layers 40 are embedded into the insulating layer 21 such that the upper surfaces of the wiring patterns 30 are not pushed in the insulating layer 21, that is, the first main surface 21A of the insulating layer 21 is lower than the upper surfaces of the wiring patterns 30. For example, if about 50% to 90% of the thickness of the wiring pattern 30 is embedded in the insulating layer 21, this is favorable from the viewpoint of heat dissipation.

Through this embedding, recessed portions 22 accommodating the wiring patterns 30 and the metal layers 40 are formed in the first main surface 21A of the insulating layer 21, and the wiring patterns 30 are formed on the bottom surfaces 22A of the recessed portions 22. In addition, a portion of the side surfaces of the wiring patterns 30 and the metal layers 40 are covered by the insulating layer 21 (come into contact with the insulating layer 21). Specifically, a portion of the side surfaces of the wiring patterns 30 and the metal layers 40 come into contact with the insulating layer 21 forming the side walls of the recessed portions 22. Thereby, as compared with a state before embedding the wiring patterns 30 and the metal layers 40 in the insulating layer 21 (refer to FIG. 15A), the contact area between the wiring patterns 30 and the metal layers 40, and the insulating layer 21 increase as much as the side surfaces of the wiring patterns 30 and the metal layers 40 come into contact with the insulating layer 21. Thereby, a heat conduction amount from the wiring patterns 30 and the metal layers 40 to the insulating layer 21 increases.

Figure 16A:
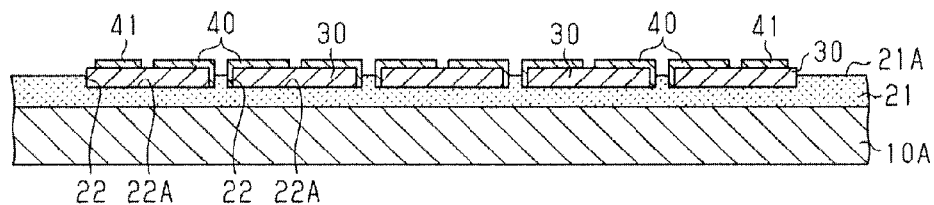
Figure 16B:
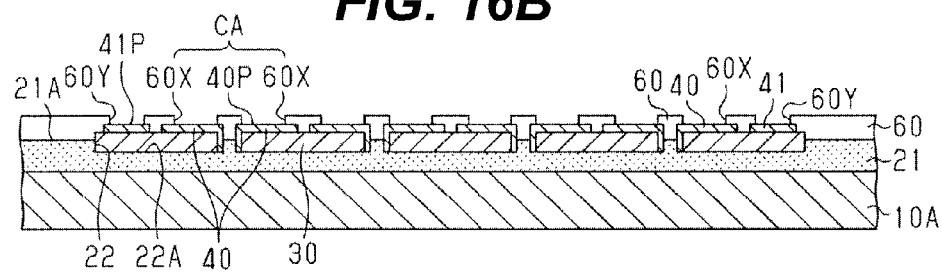
Figure 16C:
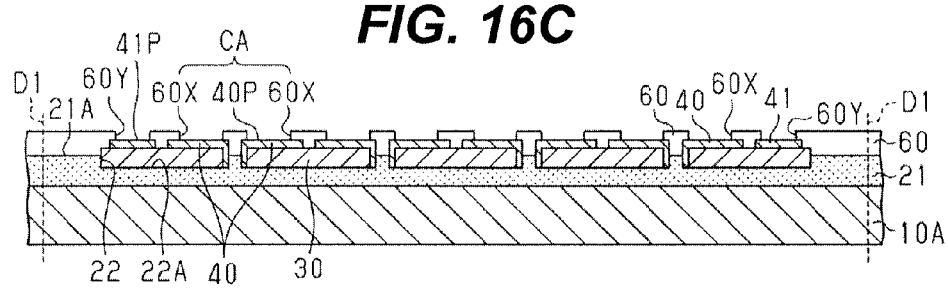
Figure 16D:
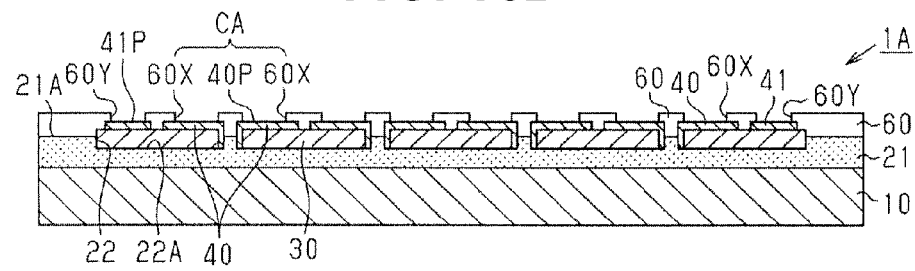

Thereafter, as shown in FIG. 16A, the pressing jigs 84 and 85 become separated from the substrate 10A. Next, in the step shown in FIG. 16B, the insulating layer 60 having the openings 60X and 60Y is formed on the insulating layer 21, the wiring patterns 30, and the metal layers 40. Next, in the step shown in FIG. 16C, the structure shown in the same figure is cut along the cutting lines D1. Thereby, as shown in FIG. 16D, the wiring substrate 1A of the present embodiment is generated as a unit piece, and a plurality of wiring substrate 1A are manufactured. In addition, in the wiring substrate 1A, the insulating layer 21 (first insulating layer) where the wiring patterns 30 are formed on the bottom surfaces 22A (first surfaces) of the recessed portions 22 and the insulating layer 21 (second insulating layer) which is formed so as to cover a portion of the side surfaces of the wiring patterns 30 are integrally formed.

According to the above-described embodiment, the same effects as in (1) to (4) of the first embodiment can be achieved.

Third Embodiment

Hereinafter, the third embodiment will be described with reference to FIGS. 17 to 21. In addition, the same members as the members shown in FIGS. 1 to 16 are given the same reference numerals, and a detailed description of each element will be omitted.

(Structure of Wiring Substrate)

Figure 17A:
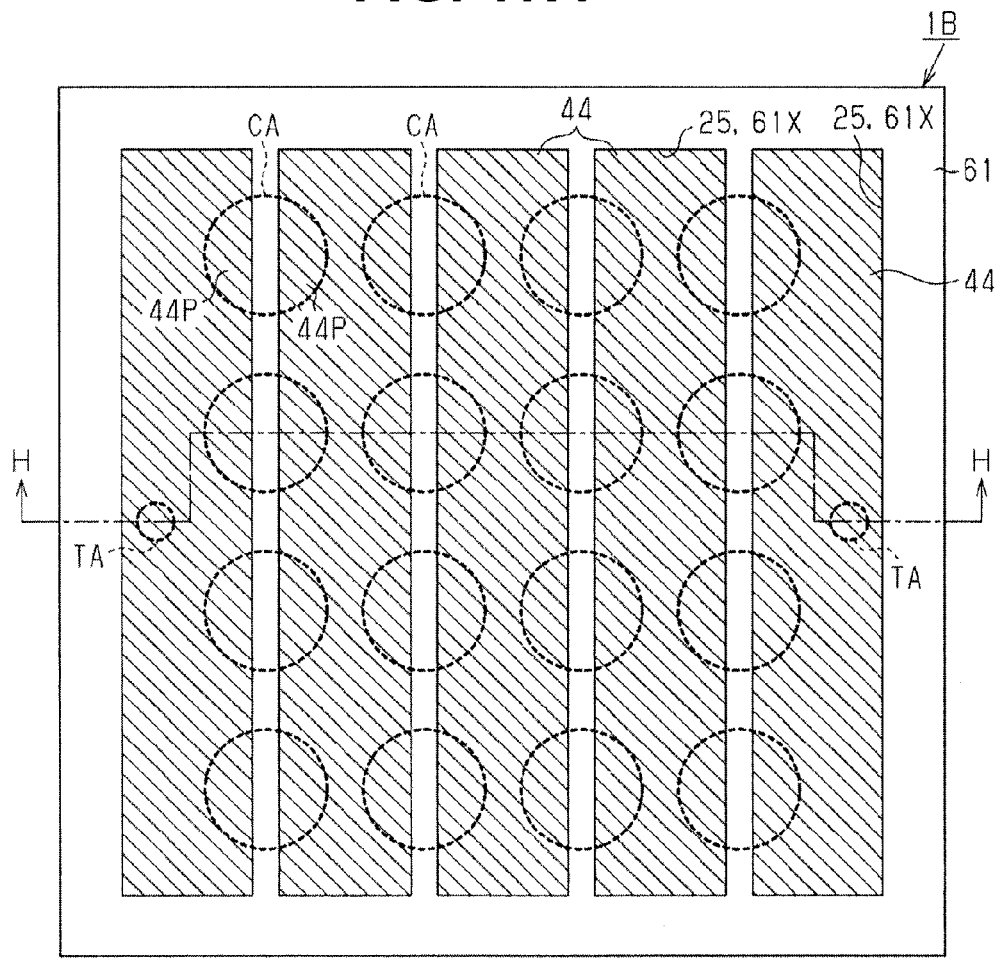
FIG. 17A is a schematic plan view illustrating a wiring substrate according to a third embodiment.
Figure 17B:
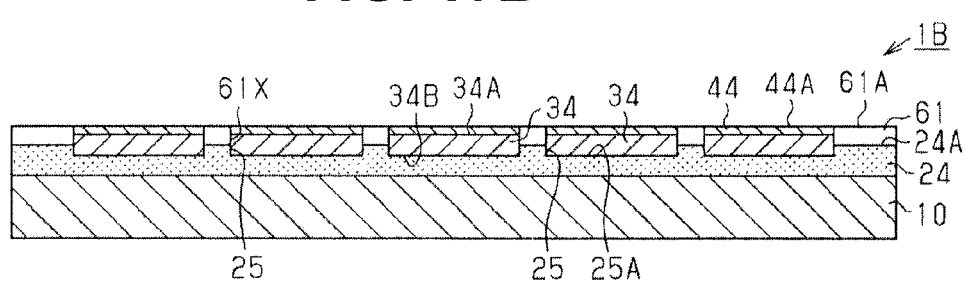
FIG. 17B is a schematic cross-sectional view taken along the line H-H of the wiring substrate shown in FIG. 17A.

As shown in FIG. 17B, a wiring substrate 1B includes a heat sink 10, an insulating layer 24 covering the upper surface of the heat sink 10, wiring patterns 34 formed on the insulating layer 24, metal layers 44 formed on the wiring patterns 34, and insulating layers 61 covering a portion of the side surfaces of the wiring patterns 34 and the entire side surfaces of the metal layers 44.

The insulating layer 24 is formed so as to cover the entire upper surface of the heat sink 10. As a material of the insulating layer 24, for example, an insulating resin with high heat conductivity (for example, about 1 W/mK to 10 W/mK) may be used. Specifically, as a material of the insulating layer 24, for example, an insulating resin such as a polyimide resin or an epoxy resin, or a resin material where a filler such as silica or alumina is mixed with the resin may be used. The insulating layer 24 has a function of insulating the heat sink 10 from the wiring patterns 34, and a function of adhering the heat sink 10 to the wiring patterns 34. The thickness of the insulating layer 24 may be, for example, about 50 µm to 130 µm. Further, in a case where the insulating layer 24 has high insulation properties, the insulating layer 24 is preferably formed thinly from the viewpoint of heat dissipation.

In addition, in the first main surface 24A (the upper surface in FIG. 17B) of the insulating layer 24, recessed portions 25 are formed at necessary locations (FIG. 17(*b*, five)). Each of the recessed portions 25 is formed from the first main surface 24A of the insulating layer 24 to a middle position of the insulating layer 24 in the thickness direction, that is, formed such that the bottom surface 25A of the recessed portion 25 is positioned in the middle of the insulating layer 24 in the thickness direction. As shown in FIG. 17A, a planar shape of the recessed portion 25 is formed in a strip shape in plan view or in a rectangular shape in plan view. In addition, the plurality of recessed portions 25 are formed in parallel so as to be adjacent to each other.

As shown in FIG. 17B, the wiring patterns 34 are formed on the bottom surfaces 25A of the respective recessed portions 25. The plurality of wiring patterns 34 are formed in parallel so as to be adjacent to each other. A portion of the side surfaces of the wiring patterns 34 are covered by (come into contact with the insulating layer 24) the insulating layer 24 forming the side walls of the recessed portions 25, and the remaining side surfaces thereof are covered by the insulating layers 61. In addition, the adjacent wiring patterns 34 are electrically separated by the insulating layer 24 and the insulating layers 61 forming the side walls of the recessed portions 25. As such, a part of the wiring pattern 34 is formed so as to be embedded in the insulating layer 24. In addition, although not shown, a planar shape of each wiring pattern 34 is formed in a strip shape in plan view or in a rectangular shape in plan view in the same manner as the planar shape of the recessed portion 25. Further, as a material of the wiring pattern 34, for example, copper or a copper alloy may be used. The thickness of the wiring pattern 34 may be, for example, about 30 μm to 100 μm. In addition, the distance between the adjacent wiring patterns 34 may be, for example, about 0.1 mm to 0.3 mm.

As such, in the wiring substrate 1B of the present embodiment, the insulating layer 24 (first insulating layer) where the wiring patterns 34 are formed on the bottom surfaces 25A (first surfaces) of the recessed portions 25 and the insulating layer 24 (second insulating layer) which is formed so as to cover a portion of the side surfaces of the wiring patterns 34 are integrally formed with each other. In addition, the insulating layer 24 is formed such that the first main surface 24A thereof is lower than the first main surface 34A (the upper surface in FIG. 17B) of the wiring pattern 34.

The metal layer 44 is formed so as to cover the entire first main surface 34A of each wiring pattern 34. Specifically, as shown in FIG. 17A, a plurality of (in FIG. 17A, five) metal layers 44 with a strip shape in plan view (a rectangular shape in plan view) are formed in parallel so as to be adjacent to each other. In addition, the adjacent metal layers 44 are electrically separated by the insulating layer 61. As shown in FIG. 17B, each of the metal layers 44 is formed such that the first main surface 44A (the upper surface in FIG. 17B) thereof is flush with the first main surface 61A (the upper surface in FIG. 17B) of the insulating layer 61. For this reason, in the metal layer 44, the entire first main surface 44A thereof is exposed from the insulating layer 61. Further, as shown in FIG. 17A, the metal layers 44 exposed from the insulating layer 61 have a plurality of regions which are mounting regions CA in which light emitting elements 70 (refer to FIG. 3) are mounted, and have a pair of terminal regions TA functioning as electrode terminals. Here, the mounting regions CA are arranged in a matrix (4×4 in FIG. 17A) on the metal layers 44. The mounting region CA includes a pair of metal layers 44 which function as pads 44P to which the light emitting elements 70 are bonded and the insulating layers 61 which electrically separates the pair of metal layers 44 from each other. In addition, a pair of terminal regions TA are formed on two metal layers 44 disposed at the outermost positions of the five metal layers 44 and are formed to the outside of the mounting regions CA disposed in the metal layers 44. An example of the metal layer 44 may include an Ag layer, an Ni/Au layer, an Ni/Ag layer, an Ni/Pd/Au layer, an Ni/Pd/Ag layer, an Ni/Pd/Ag/Au layer, or the like. Furthermore, in a case where the metal layer 44 is, for example, an Ni/Au layer, the thickness of the Ni layer may be about 1 μm to 10 μm, and the thickness of the Au layer may be about 0.05 μm to 2 μm.

As shown in FIG. 17B, the insulating layers 61 is formed on the first main surface 24A of the insulating layer 24 so as to cover a portion of the side surfaces of the wiring patterns 34 and the entire side surfaces of the metal layers 44. From another viewpoint, openings 61X communicating with the recessed portions 25 are formed at positions opposite to the recessed portions 25 of the insulating layer 24 in the insulating layers 61. As shown in FIG. 17A, a planar shape of the opening 61X is formed in a strip shape in plan view or a rectangular shape in plan view. In addition, a plurality of openings 61X are formed in parallel so as to be adjacent to each other. As shown in FIG. 17B, the wiring patterns 34 and the metal layers 44 are formed in the openings 61X.

The insulating layer 61 has high reflectance. Specifically, the insulating layer 61 has reflectance of 50% or more (appropriately, 80% or more) between the wavelengths 450 nm to 700 nm. The insulating layer 61 is also referred to as a white resist layer or a reflective layer. As a material of the insulating layer 61, for example, a white insulating resin may be used. As the white insulating resin, for example, a resin material where a filler or a pigment formed from white titanium oxide ($TiO_2$) or barium sulfate ($BaSO_4$) is contained in an epoxy resin, a silicone resin, or an organopolysiloxane resin. In addition, the thickness of the insulating layer 61 may be, for example, 20 μm to 50 μm.

(Manufacturing Method of the Wiring Substrate)

Next, a manufacturing method of the wiring substrate 1B will be described with reference to FIGS. 18 to 21.

Figure 18A:
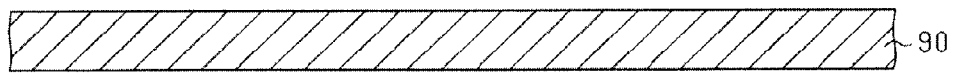
FIGS. 18A, 18B and 18D are schematic cross-sectional views illustrating manufacturing steps of the wiring substrate according to the third embodiment.

First, in order to manufacture the wiring substrate 1B, as shown in FIG. 18A, a multi-piece supporting substrate 90 is prepared. The supporting substrate 90 has a plurality of wiring substrate forming regions which are regions in which the wiring substrate 1B is formed in the same manner as the substrate 10A. In the supporting substrate 90, a structure corresponding to the wiring substrate 1B is formed in each wiring substrate forming region, and is cut along the position corresponding to the cutting lines D1 (see FIG. 4) of the multi-piece substrate 10A using a dicing blade or the like after the supporting substrate 90 is removed, and thereby the structure corresponding to the wiring substrate 1B is formed as a unit piece.

As the supporting substrate 90, for example, a metal plate or a metal foil may be used, and, in the present embodiment, for example, a copper plate is used. The thickness of the supporting substrate 90 may be, for example, 0.3 mm to 1.0 mm. In addition, for convenience of description, in FIGS. 18 to 21 described later, a structure of a single wiring substrate forming region is shown.

Figure 18B:
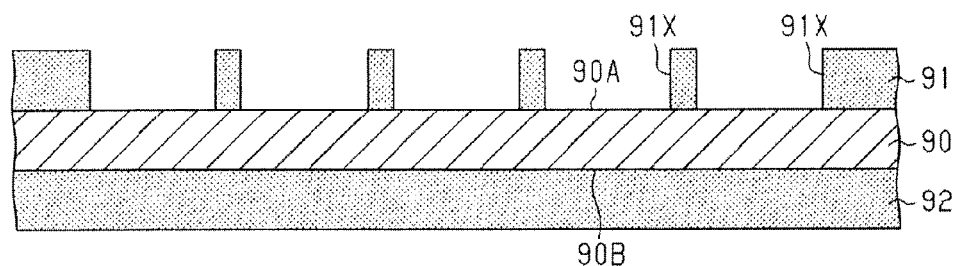
Figure 18C:
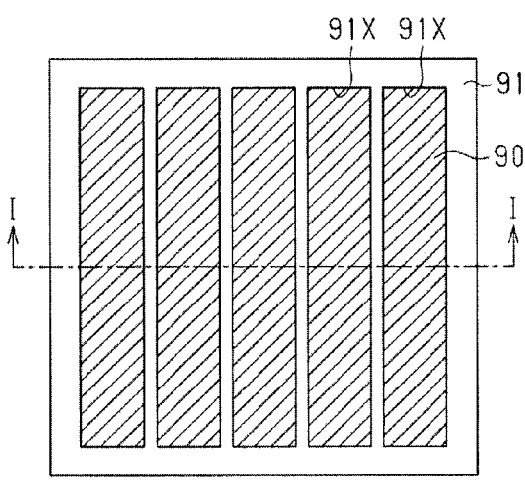

Next, in the step shown in FIG. 18B, a resist layer 91 having openings 91X is formed on the first main surface 90A (the upper surface in the figure) of the supporting substrate 90, and a resist layer 92 which covers the entire second main surface 90B (the lower surface in the figure) of the supporting substrate 90 is formed. The opening 91X is formed so as to expose the first main surface 90A of the supporting substrate 90 of a portion corresponding to the forming region of the wiring patterns 34 and the metal layers 44 (refer to FIG. 17B). In other words, as shown in FIG. 18C, a plurality of (here, five) openings 91X with a strip shape in plan view (a rectangular shape in plan view) are formed in parallel so as to be adjacent to each other in the resist layer 91. As shown in FIG. 18B, the resist layer 91 is formed relatively thickly (for example, about 0.05 mm to 0.15 mm). The resist layer 91 may be formed by overlapping a plurality of resist layers. On the other hand, the thickness of the resist layer 92 is sufficient as long as the resist layer 92 covers the entire second main surface 90B so as to prevent the second main surface 90B of the supporting substrate 90 from being plated in the subsequent step, and may be, for example, about 0.02 mm to 0.05 mm. In addition, as a material of the resist layers 91 and 92, a plating resistant material may be used. Specifically, as a material of the resist layers 91 and 92, a photosensitive dry film resist, a liquid photoresist (for example, a dry film resist or a liquid resist of a Novolac resin, an acryl resin, or the like), and the like may be used. For example, in a case of using the photosensitive dry film resist, a dry film is formed on both the surfaces of the supporting substrate 90 through thermocompression, and the dry film formed on the first main surface 90A of the supporting substrate 90 is patterned through exposure and development, thereby forming the resist layers 91 and 92. Further, in a case where the liquid photoresist is used as well, the resist layers 91 and 92 may be formed through the same steps.

Figure 18D:
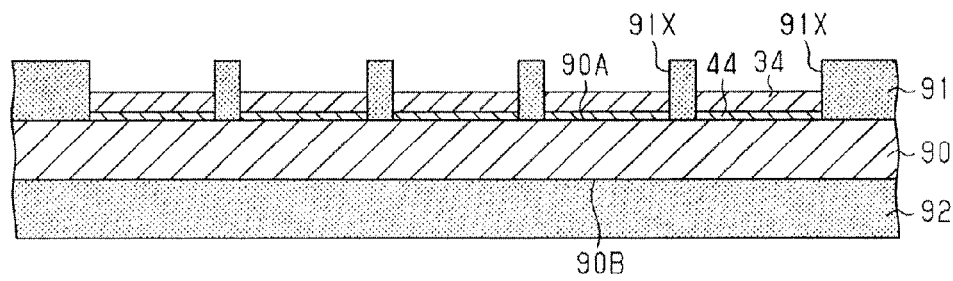

Next, in the step shown in FIG. 18D, electrolytic plating where the supporting substrate 90 is used as a plating feed layer is performed on the first main surface 90A of the supporting substrate 90 by using the resist layers 91 and 92 as a plating mask. Specifically, by performing the electrolytic plating on the first main surface 90A of the supporting substrate 90 exposed from the openings 91X of the resist layer 91, the metal layers 44 and the wiring patterns 34 are sequentially formed in the openings 91X. For example, in a case where the metal layer 44 is a structure in which an Au layer and an Ni layer are sequentially formed in this order, and the wiring pattern 34 is a Cu layer, first, the Au layer and the Ni layer are formed in order on the first main surface 90A of the supporting substrate 90 through an electrolytic plating method where the supporting substrate 90 is used as a plating feed layer, thereby forming the metal layer 44. Next, the Cu layer is formed on the metal layer 44 through the electrolytic plating method where the supporting substrate 90 is used as a plating feed layer, thereby forming the wiring pattern 34.

Figure 19A:
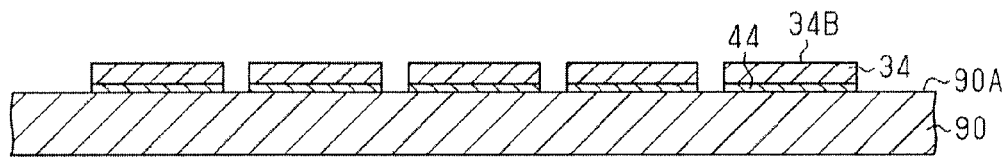
FIGS. 19A and 19C are schematic cross-sectional views illustrating the manufacturing steps of the wiring substrate according to the third embodiment.
Figure 19B:
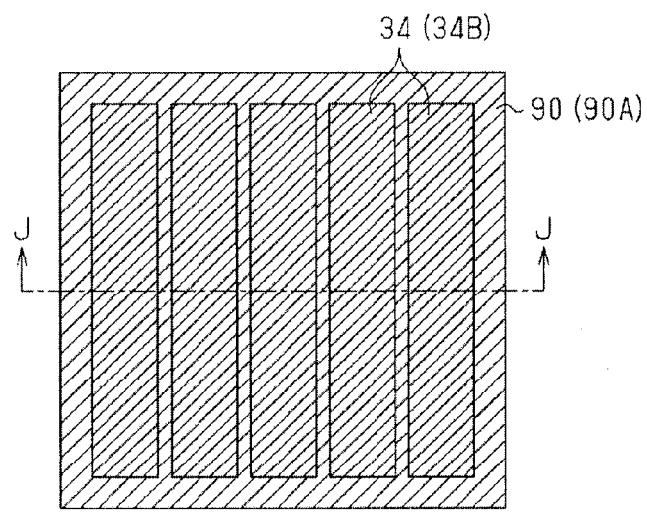

Next, in the step shown in FIG. 19A, the resist layers 91 and 92 shown in FIG. 18D are removed by, for example, an alkaline stripping agent. At this time, as shown in FIG. 19B, a plurality of wiring patterns 34 (specifically, the second main surfaces 34B of the wiring patterns 34) with a strip shape in plan view are exposed in the first main surface 90A of the supporting substrate 90.

Figure 19C:
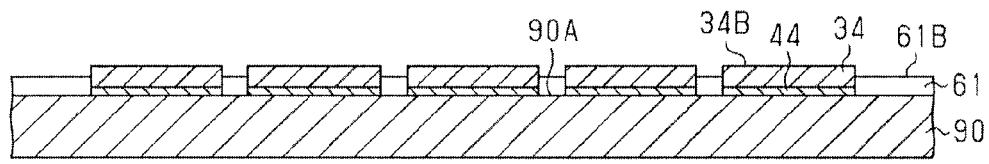

Next, in the step shown in FIG. 19C, the insulating layers 61 are formed on the first main surface 90A of the supporting substrate 90 exposed from the wiring patterns 34 so as to cover the entire side surfaces of the metal layers 44 and a portion of the side surfaces of the wiring patterns 34. The insulating layers 61 are formed such that the second main surfaces 61B (the upper surfaces in the figure) thereof are lower than the second main surfaces 34B of the wiring patterns 34. For this reason, step differences are formed at the interfaces between the insulating layers 61 and the wiring patterns 34. In other words, recessed portions are formed between the wiring patterns 34 and in the regions to the outside of the wiring patterns 34. The insulating layers 61 may be formed according to, for example, a screen printing method using a resin paste. Next, in the step shown in FIG. 19C, the insulating layers 61 are cured by performing a heat curing treatment in a temperature atmosphere of about 150° C.

Figure 20A:
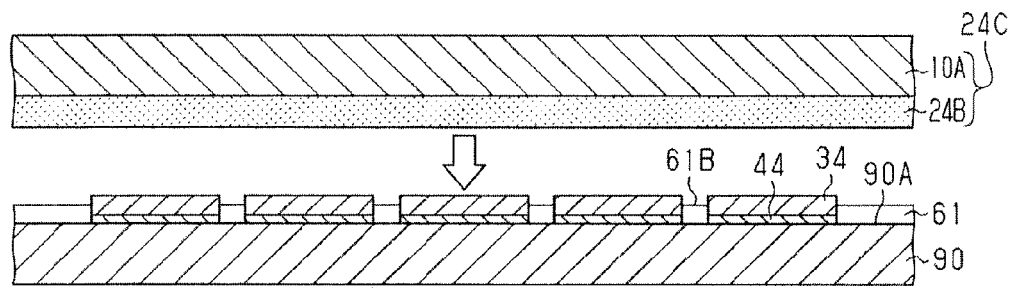
FIGS. 20A to 20D are schematic cross-sectional views illustrating the manufacturing steps of the wiring substrate taken along the line J-J position of FIG. 19B.

Next, in the step shown in FIG. 20A, a structure 24C where a sheet-shaped insulating layer 24B which will become the insulating layer 24 is adhered to a substrate 10A is prepared. As a material of the substrate 10A, a metal with favorable heat conductivity such as, for example, copper, aluminum, or iron, or an alloy including at least one of these metals may be used. As a material of the insulating layer 24B, for example, an insulating resin such as a thermosetting epoxy resin or polyimide resin, or a resin material where a filler such as silica or alumina is mixed with the resin may be used. The insulating layer 24B uses one in a B-stage state (half cured state). The thickness of the insulating layer 24B may be, for example, about 50 μm to 130 μm.

Figure 20B:
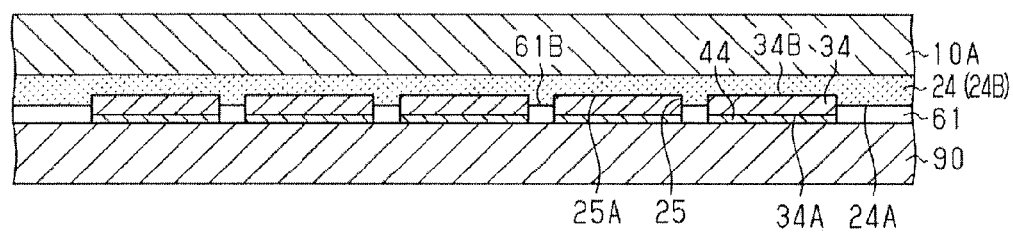

In addition, in the step shown in FIG. 20A, the structure 24C is disposed on the upper surface side of the structure shown in FIG. 19C. At this time, the structure 24C is disposed in a state where the insulating layer 24B faces downwardly such that the insulating layer 24B faces the second main surfaces 61B (the upper surface in FIG. 20B) of the insulating layers 61 and the wiring patterns 34. In addition, the sheet-shaped structure 24C is formed on the structure shown in FIG. 19C through thermocompression. Through the thermocompression at this time, as shown in FIG. 20B, the wiring patterns 34 exposed from the insulating layers 61 are pushed into the insulating layer 24B. Thereby, the second main surfaces 61B of the insulating layers 61, and the side surfaces of the wiring patterns 34 and the entire second main surfaces 34B of the wiring patterns 34 exposed from the insulating layers 61 are covered with the insulating layer 24B. Thereafter, the insulating layer 24B is cured by performing a heat curing treatment in a temperature atmosphere of about 150° C., thereby forming the insulating layer 24. When the insulating layer 24B is cured, the insulating layer 24 is adhered to the insulating layers 61 and the wiring patterns 34, and the substrate 10A is adhered to the insulating layer 24.

Through this step, recessed portions 25 accommodating a portion of the wiring patterns 34 are formed in the first main surface 24A of the insulating layer 24, and the wiring patterns 34 are formed on the bottom surfaces 25A of the recessed portions 25. In addition, a portion of the side surfaces of the wiring patterns 34 are covered by the insulating layer 24 (come into contact with the insulating layer 24). Specifically, a portion of the side surfaces of the wiring patterns 34 come into contact with the insulating layer 24 forming the side walls of the recessed portions 25. Thereby, as compared with a case where only the second main surfaces 34B of the wiring patterns 34 come into contact with the insulating layer 24, the contact area between the wiring patterns 34 and the insulating layer 24 increase as much as the side surfaces of the wiring patterns 34 come into contact with the insulating layer 24. Thereby, a heat conduction amount from the wiring patterns 34 to the insulating layer 24 increases. In addition, at this time, since the insulating layers 61 are formed so as to cover a portion of the side surfaces of the wiring patterns 34, the first main surface 24A (the lower surface in FIG. 20B) of the insulating layer 24 formed on the insulating layers 61 is formed so as to be higher than the first main surface 34A of the wiring pattern 34 (lower than that in a case of being vertically reversed).

Figure 20C:
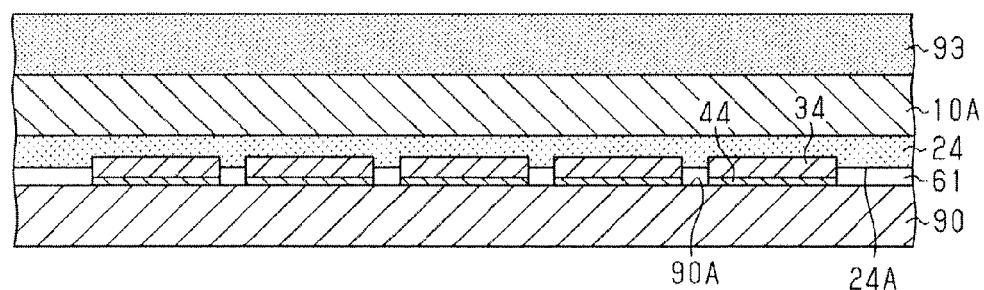

Next, in the step shown in FIG. 20C, a resist layer 93 which covers the entire one surface (the upper surface in FIG. 20C) of the substrate 10A is formed. The resist layer 93 is formed so as to prevent the upper surface of the substrate 10A from being etched in the subsequent step. In addition, as a material of the resist layer 93, an etching resistant material may be used. Specifically, as a material of the resist layer 93, a photosensitive dry film resist, a liquid photoresist (for example, a dry film resist or a liquid resist of a Novolac resin, an acryl resin, or the like), and the like may be used.

Figure 20D:
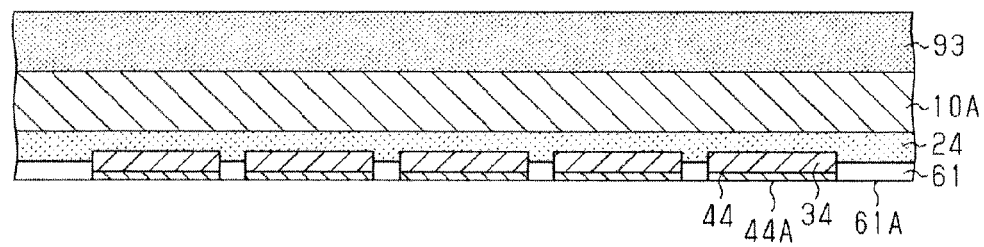

Next, in the step shown in FIG. 20D, the supporting substrate 90 (see FIG. 20C) which is used as a temporary substrate is removed. For example, in a case where a copper plate is used as the supporting substrate 90, the supporting substrate 90 may be removed through wet etching using a ferric chloride solution, a cupric chloride solution, an ammonium persulfate solution, or the like. At this time, since the outermost surface of the metal layer 44 exposed from the insulating layers 61 is an Au layer or the like, only the supporting substrate 90 which is a copper plate can be selectively etched. When the supporting substrate 90 is removed in this way, the first main surfaces 44A of the metal layers 44 and the first main surfaces 61A of the insulating layers 61 which are formed along the shape of the first main surface 90A of the supporting substrate 90 are flush with each other. Thereafter, the resist layer 93 is removed by, for example, an alkaline stripping agent.

Figure 21A:
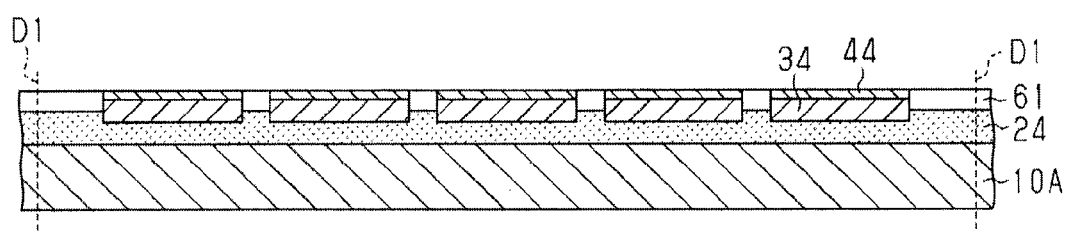
FIGS. 21A and 21B are schematic cross-sectional views illustrating the manufacturing steps of the wiring substrate taken along the line J-J position of FIG. 19B.
Figure 21B:
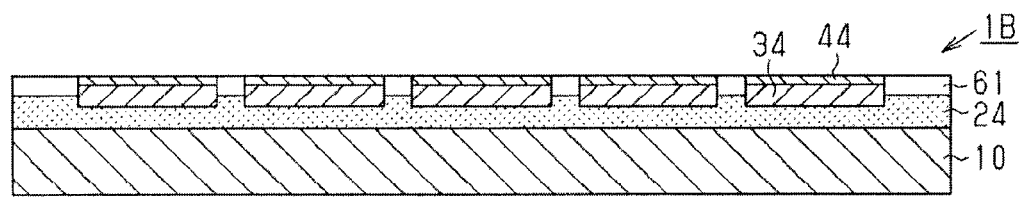

Next, in the step shown in FIG. 21A, the structure shown in the same figure is cut along the cutting lines D1. Thereby, as shown in FIG. 21B, the wiring substrate 1B according to the present embodiment is formed as a unit piece, thereby manufacturing a plurality of wiring substrates 1B. In addition, in FIG. 21A, the structure shown in the same figure is shown so as to be vertically reverse to that shown in FIG. 20D.

According to the above-described embodiment, in addition to the effects in (1) to (4) of the first embodiment, the following effects can be achieved.

(7) The first main surface 61A (the outermost surfaces) of the insulating layer 61 formed in the outermost surface of the mounting surface side where the light emitting element 70 is mounted is formed so as to be flush with the first main surface 44A (the outermost surface) of the metal layer 44 functioning as the pad 44P. Thereby, since the insulating layer 61 does not protrude further upward than the surface of the pad 44P, interference (contact) between the insulating layer 61 and the light emitting element 70 which is flip-chip bonded onto the pads 44P is appropriately suppressed. For this reason, even if the bumps 71 of the light emitting element 70 are made fine and thereby a gap between the light emitting element 70 and the pads 44P is narrowed, it is possible to appropriately suppress interference between the insulating layer 61 and the light emitting element 70. Therefore, the light emitting element 70 can be mounted using the fine bumps 71, and thereby it is possible to miniaturize the entire light emitting device.

(8) Since the electrolytic plating method can be performed using the supporting substrate 90 as a feed layer, it is not necessary to form a feed line for electrolytic plating.

Modified Examples of Third Embodiment

In addition, the third embodiment may be performed in the following aspects by appropriately modifying the embodiment.

Figure 22A:
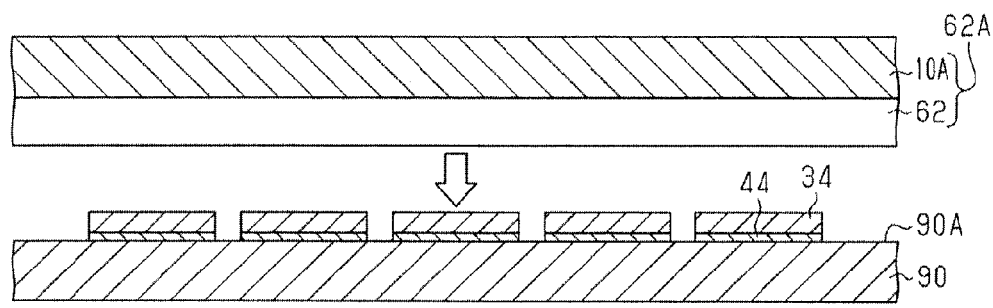

The insulating layer 24 in the third embodiment may be omitted, and the entire side surfaces of the wiring patterns 34 may be covered by an insulating layer which functions as a reflective layer. In this case, the wiring substrate may be manufactured according to, for example, the following manufacturing method. Specifically, as shown in FIG. 22A, a structure 62A where a sheet-shaped insulating layer 62 is adhered to the substrate 10A is disposed over a structure where the metal layers 44 and the wiring patterns 34 are formed on the first main surface 90A of the supporting substrate 90. At this time, the structure 62A is disposed in a state where the insulating layer 62 faces downwardly such that the insulating layer 62 faces the wiring patterns 34 and the supporting substrate 90. As a material of the substrate 10A, a metal with favorable heat conductivity such as, for example, copper, aluminum, or iron, or an alloy including at least one of these metals may be used. As a material of the insulating layer 62, for example, a white insulating resin which has high reflectance and a thermosetting property may be used. In addition, a material of the insulating layer 62 is preferably an insulating resin having the high heat conductivity. Further, as the white insulating resin, for example, a resin material where a filler or a pigment formed from white titanium oxide or barium sulfate is contained in an epoxy resin or a silicone resin may be used.

Figure 22B:
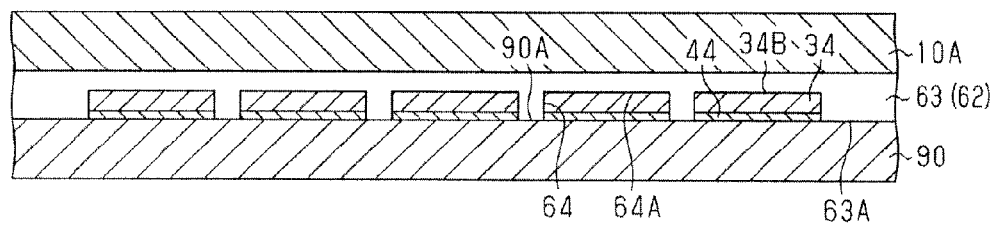

In addition, the sheet-shaped structure 62A is formed on the first main surface 90A of the supporting substrate 90 through thermocompression. Through the thermocompression at this time, as shown in FIG. 22B, the wiring patterns 34 and the metal layers 44 are pushed into the insulating layer 62. Thereby, the first main surface 90A of the supporting substrate 90, the entire side surfaces of the wiring patterns 34, the entire side surfaces of the metal layers 44, and the entire second main surfaces 34B of the wiring patterns 34 are covered with the insulating layer 62. Thereafter, the insulating layer 62 is cured by performing a heat curing treatment in a temperature atmosphere of about 150° C., thereby forming an insulating layer 63.

In addition, through this step, recessed portions 64 which accommodate the wiring patterns 34 and the metal layers 44 in the first main surface 63A of the insulating layer 63, and the wiring patterns 34 are formed on the bottom surfaces 64A of the recessed portions 64. In addition, the insulating layer 63 is formed so as to cover the entire side surfaces of the metal layers 44, the entire side surfaces of the wiring patterns 34, and the entire second main surfaces 34B of the wiring patterns 34.

According to the manufacturing method, the wiring patterns 34 and the metal layers 44 are pushed in the insulating layer 62, and the insulating layer 63 which covers the wiring patterns 34 and the metal layers 44 is formed. For this reason, according to the manufacturing method, even if a gap between the wiring patterns 34 and a gap between the metal layers 44 are narrowed, the insulating layer 63 can be easily formed between the wiring patterns 34 and between the metal layers 44. In addition, the insulating layer 62 is formed in the vacuum atmosphere, and thereby it is possible to suppress void from being generated into the insulating layer 62.

Figure 22C:
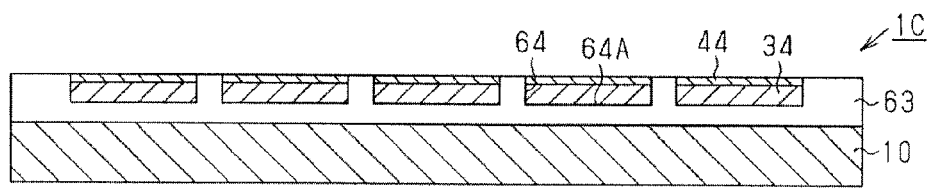

Thereafter, in the same manner as the steps shown in FIGS. 20C to 21C, the supporting substrate 90 is removed through etching, the substrate 10A and the like are cut along the cutting lines D1 so as to be formed as a unit piece, and thereby a wiring substrate 1C as shown in FIG. 22C can be obtained. In addition, in the wiring substrate 1C, the insulating layer 24 is omitted, and thus the insulating layer 63 which serves as a reflective layer has functions of adhering the heat sink 10 to the wiring patterns 34 and of insulating the heat sink 10 from the wiring patterns 34. In addition, in the wiring substrate 1C, the insulating layer 63 (first insulating layer) where the wiring patterns 34 are formed on the bottom surfaces 64A (first surfaces) of the recessed portions 64 and the insulating layer 63 (second insulating layer) which is formed so as to cover a portion of the side surfaces of the wiring patterns 34 are integrally formed. Further, in the wiring substrate 1C, since the insulating layer 24 is omitted, the resin layer interposed between the wiring patterns 34 and the heat sink 10 can be made to be thin, and thus it is possible to improve heat dissipation performance.

Figure 23A:
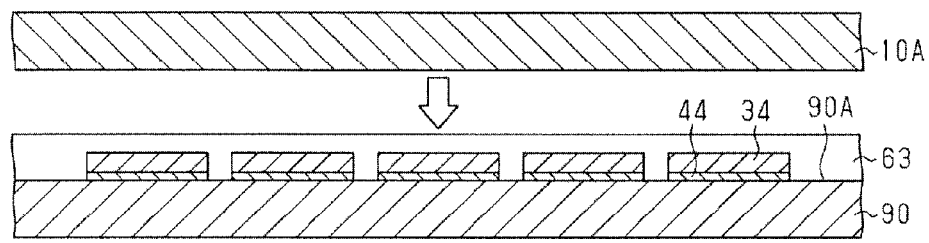
Figure 23B:
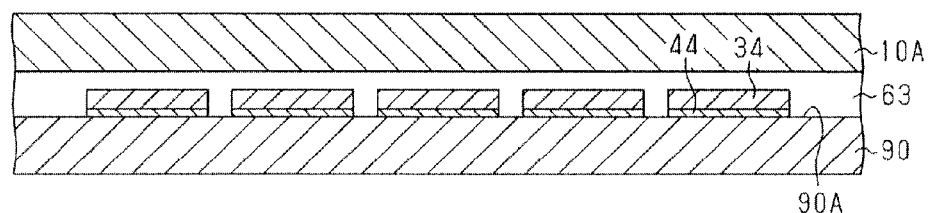

In addition, for example, as shown in FIG. 23A, the insulating layer 63 may be formed so as to cover the metal layers 44 and the wiring patterns 34 formed on the first main surface 90A of the supporting substrate 90, and the substrate 10A may be formed on the insulating layer 63. Even in this case, as shown in FIG. 23B, the substrate 10A and the wiring patterns 34 are adhered to each other via the insulating layer 63, and the substrate 10A and the wiring patterns 34 are insulated from each other by the insulating layer 63. In addition, the insulating layer 63 is formed so as to cover the entire side surfaces of the metal layers 44, the entire surfaces of the wiring patterns 34, and the entire second main surfaces 34B of the wiring patterns 34. That is, even using this manufacturing method, it is possible to manufacture the wiring substrate having the same structure as that of the wiring substrate 1C shown in FIG. 22C. Further, the insulating layer 63 in this case is preferably entirely applied and thus may be formed according to, for example, not only a screen printing method but also a roll covering method, using a resin paste.

Figure 24A:
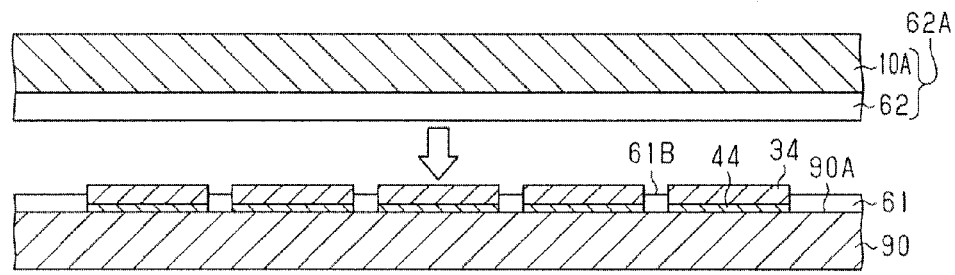
Figure 24B:
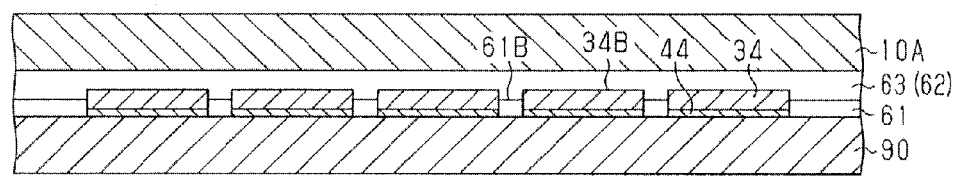

In addition, for example, as shown in FIG. 24, the structure 62A where the sheet-shaped insulating layer 62 made of the same material as that of the insulating layer 61 is adhered to the substrate 10A may be formed on a structure where the insulating layers 61 covering the entire side surfaces of the metal layers 44 and a portion of the side surfaces of the wiring patterns 34 are formed on the first main surface 90A of the supporting substrate 90. Specifically, as shown in FIG. 24A, the sheet-shaped structure 62A is formed on the second main surfaces 61B of the insulating layers 61 through thermocompression. Through the thermocompression at this time, as shown in FIG. 24B, the wiring patterns 34 exposed from the insulating layers 61 are pushed into the insulating layer 62. Thereby, the second main surfaces 61B of the insulating layers 61, and the side surfaces of the wiring patterns 34 and the entire second main surfaces 34B of the wiring patterns 34 exposed from the insulating layers 61, are covered with the insulating layer 62. Thereafter, the insulating layer 62 is cured by performing a heat curing treatment in a temperature atmosphere of about 150° C., thereby forming the insulating layer 63. Through this step, the insulating layer 63 and the substrate 10A are formed on the second main surfaces 61B of the insulating layers 61. Even in the structure and the manufacturing method, it is possible to achieve the same effects as in (1) to (4) of the first embodiment.

Although, in the third embodiment, the sheet-shaped insulating resin is used as a material of the insulating layer 24B which becomes the insulating layer 24, a liquid or paste insulating resin may be used as a material of the insulating layer 24B. In addition, although, in the modified examples described with reference to FIGS. 22 and 24, the sheet-shaped insulating resin is used as a material of the insulating layer 62 which becomes the insulating layer 63, a liquid or paste insulating resin may be used as a material of the insulating layer 62.

Other Embodiments

In addition, each of the above-described embodiments described above may be performed in the following aspects by appropriately modifying the embodiment.

Each of the embodiments is implemented using the multi-piece manufacturing method, but may be implemented using a single-piece manufacturing method. In other words, a base material with the size corresponding to a single wiring substrate 1, 1A 1B or 1C may be used instead of the multi-piece substrate 10A, and the wiring substrate 1, 1A, 1B or 1C and the light emitting device 2 may be manufactured.

A planar shape of each of the wiring substrate 1, 1A, 1B or 1C and the light emitting device 2 in each embodiment is not limited to a rectangular shape, and may be, for example, a polygonal shape such as a triangular shape or a pentagonal shape, or a circular shape.

The number or arrangement of the light emitting elements 70 mounted on the wiring substrate 1, 1A, 1B or 1C in each embodiment is not particularly limited.

Figure 25A:
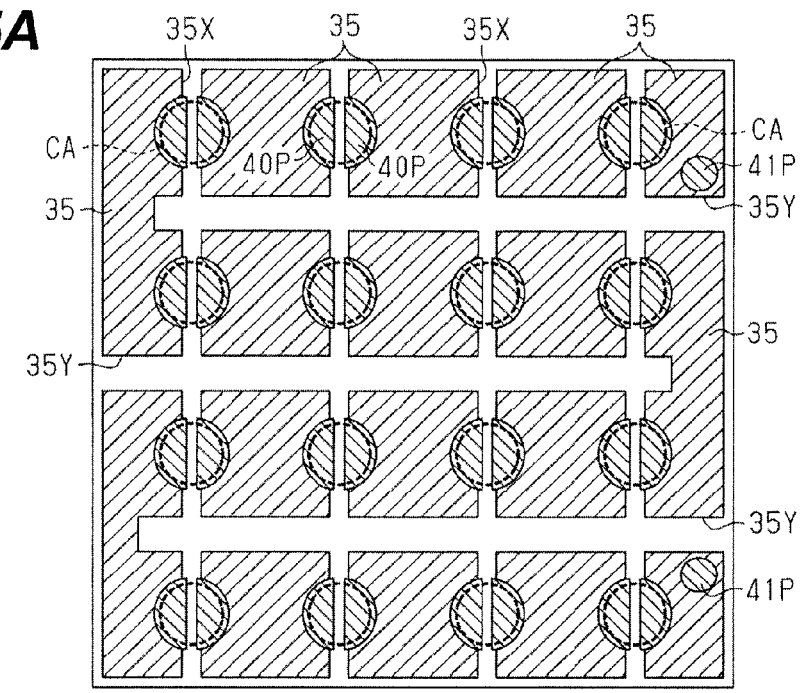
FIGS. 25A and 25B are schematic plan views illustrating a wiring pattern according to a modified example.

A shape of the wiring pattern 30 or 34 in each embodiment is not particularly limited. For example, there may be a modification to a wiring pattern as shown in FIG. 25A. In other words, a plurality of wiring patterns 35 with an approximately rectangular shape in plan view may be disposed in an approximately W shape in plan view. In this case, a groove-shape opening 35X extending in the vertical direction of the figure is formed between the wiring patterns 35 which are adjacent to each other in the horizontal direction of the figure. In addition, a strip-shaped opening 35Y extending in the horizontal direction of the figure is formed between the wiring patterns 35 which are adjacent to each other in the vertical direction of the figure. A plurality of wiring patterns 35 are separated from each other by the openings 35X and 35Y. Metal layers functioning as the pads 40P are formed on the wiring patterns 35. The wiring patterns 35 have mounting regions CA (refer to the broken line circles) arranged in a matrix (here, 4×4). In addition, a pair of metal layers functioning as the electrode terminals 41P are formed on the wiring patterns 35. The pair of electrode terminals 41P are respectively formed on the wiring patterns 35 which are positioned at the start point and end point of the W shape among a plurality of wiring patterns 35 arranged in an approximately W shape. In a case where light emitting elements are mounted on a wiring substrate provided with the wiring patterns 35 and the electrode terminals 41P, a plurality of (here, sixteen) light emitting elements are connected in series between one electrode terminal 41P and the other electrode terminal 41P.

Figure 25B:
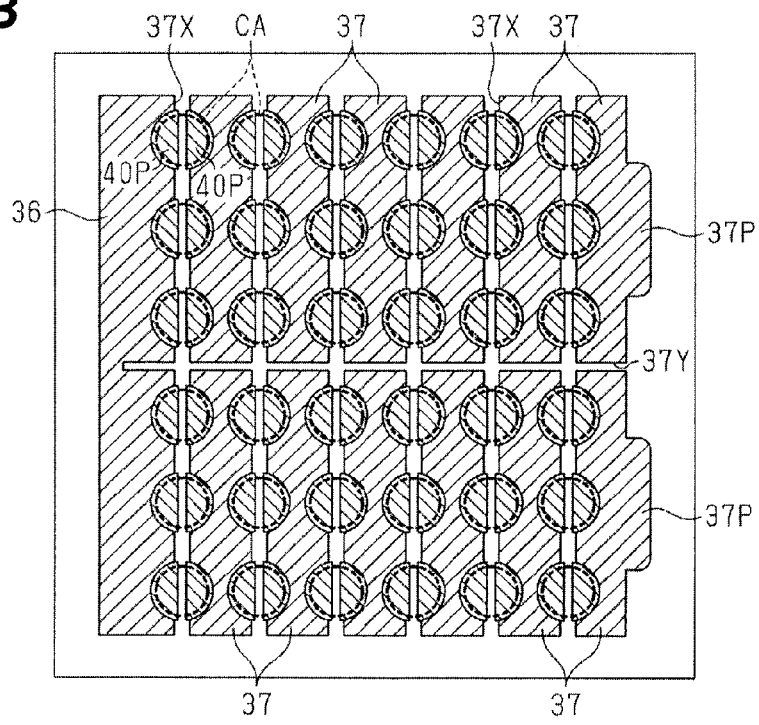

Alternatively, there may be a modification to a wiring pattern as shown in FIG. 25B. In other words, a wiring pattern 36 with an approximately strip shape in plan view may be disposed, and a plurality of wiring patterns 37 with an approximately rectangular shape in plan view, disposed in parallel to the wiring pattern 36 so as to be adjacent to each other, may be disposed in a matrix (here, 6×2). That is, the wiring pattern 36 is commonly provided with respect to the adjacent wiring patterns 37 of two rows. In this case, groove-shaped openings 37X extending in the vertical direction of the figure are formed between the wiring patterns 36 and 37 and between the respective wiring patterns 37 which are adjacent to each other in the horizontal direction of the figure. In addition, strip-shaped openings 37Y extending in the horizontal direction of the figure are formed between the wiring patterns 37 which are adjacent to each other in the vertical direction of the figure. The wiring patterns 36 and 37, and the wiring patterns 37 are respectively separated from each other by the openings 37X and 37Y. Metal layers functioning as the pads 40P are formed on the wiring patterns 36 and 37. The wiring patterns 36 and 37 have mounting regions CA (refer to the broken line circles) arranged in a matrix (here, 6×6). In addition, the wiring patterns 37 have a pair of electrode terminals 37P. The pair of electrode terminals 37P are formed in two wiring patterns 37 which is the farthest from the wiring pattern 36. In a case where light emitting elements are mounted on a wiring substrate provided with the wiring patterns 36 and 37 and the electrode terminals 37P, the light emitting elements arranged in a matrix (here, 6×3) are connected in series and in parallel between the wiring pattern 36 and one electrode terminal 37P. In addition, the light emitting elements arranged in a matrix are connected in series and in parallel between the wiring pattern 36 and the other electrode terminal 37P. Further, the light emitting element groups connected in series and in parallel are connected in series.

Figure 26:
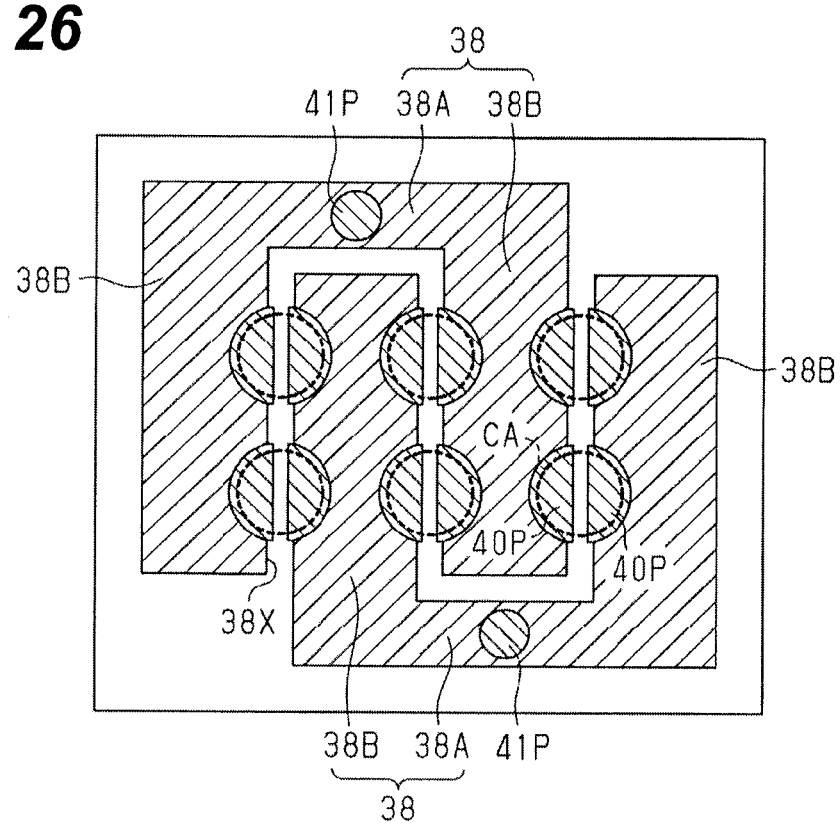
FIG. 26 is a schematic plan view illustrating a wiring pattern according to a modified example.

Alternatively, there may be a modification to a wiring pattern as shown in FIG. 26. In other words, a pair of wiring patterns 38 with an approximately comb shape in plan view may be formed. Specifically, the wiring pattern 38 has an electrode portion 38A which is formed in a rectangular shape in plan view and has an upper surface on which a metal layer functioning as the electrode terminal 41P is formed, and a plurality (in FIG. 26, two) of extending portions 38B with a comb-teeth shape extending inward from the electrode portion 38A. The pair of wiring patterns 38 are disposed such that the mutual extending portions 38B are alternately arranged. In this case, an opening 38X with an approximately Z shape in plan view is formed between the wiring patterns 38. The pair of wiring patterns 38 are separated from each other by the opening 38X. Metal layers functioning as the pads 40P are formed on the extending portions 38B. The wiring patterns 38 have mounting regions CA arranged in a matrix (here, 3×2).

The mounting region CA includes the pads 40P formed on a pair of wiring patterns 38 separated by the opening 38X. In a case where light emitting elements are mounted on a wiring substrate provided with the wiring patterns 38 and the electrode terminals 41P, a plurality of light emitting elements are connected in series and in parallel between one electrode terminal 41P and the other electrode terminal 41P.

(Application Example of Light Emitting Device)

Figure 27:
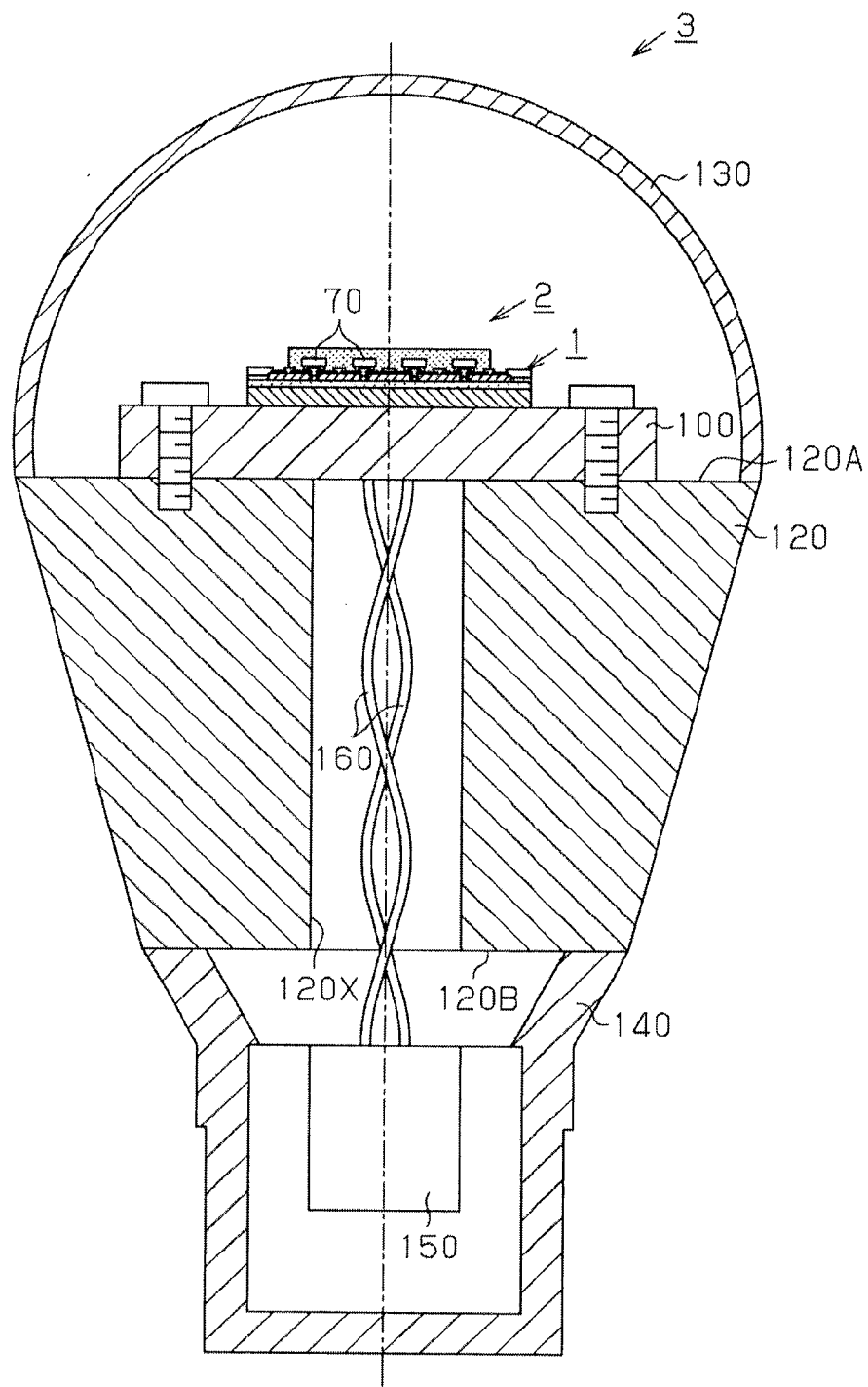
FIG. 27 is a schematic cross-sectional view illustrating an application example of the light emitting device.

FIG. 27 shows a cross-sectional view when the light emitting device 2 according to the first embodiment is applied to an illumination apparatus 3.

The illumination apparatus 3 includes the light emitting device 2, a mounting board 100 having the light emitting device 2 mounted thereon, and an apparatus main body 120 in which the mounting board 100 is installed. In addition, the illumination apparatus 3 includes a cover 130 which is installed in the apparatus main body 120 and covers the light emitting device 2, a holder 140 which holds the apparatus main body 120, and a lighting circuit 150 which is fitted to the holder 140 and turns on the light emitting elements 70.

The apparatus main body 120 is formed in an approximately truncated conical shape in plan view. The apparatus main body 120 has a cross section 120A with a large diameter in which the mounting board 100 and the cover 130 are installed, and a cross section 120B with a small diameter. The apparatus main body 120 is made of, for example, aluminum or the like having good heat conductivity. The mounting board 100 is installed in the cross section 120A of the apparatus main body 120 using well-known installation means (here, screws). In addition, the apparatus main body 120 is provided with a through-hole 120X which penetrates between the cross section 120A and the cross section 120B. Wires 160 which are electrically connected to the light emitting elements 70 of the light emitting device 2 via the mounting board 100 are disposed in the through-hole 120X. The wires 160 are lead to the cross section 120B side from the cross section 120A side via the through-hole 120X.

The cover 130 formed in an approximately dome shape in exterior view is fixed to the cross section 120A of the apparatus main body 120 by an adhesive such as a silicone resin such that the inside of the cover 130 is in an airtight state. In addition, the cover 130 is made of, for example, hard glass.

The holder 140 is made of, for example, a polybutylene terephthalate (PBT) resin or a polyethersulfone (PES) resin. The holder 140 is installed in the cross section 120B of the apparatus main body 120 using well-known installation means (an adhesive, a screw, or the like). A socket (not shown) is fitted to the holder 140. The lighting circuit 150 is accommodated inside the holder 140 and the socket. For example, a circuit board (not shown) of the lighting circuit 150 on which circuit components are mounted is attached to the holder 140. The lighting circuit 150 is a circuit which converts an AC voltage supplied from the socket into a DC voltage, and supplies the DC voltage to the light emitting elements 70 via the wires 160 such that the light emitting elements 70 emit light.

Next, detailed examples where the light emitting device 2 is mounted on the mounting board 100 will be described.

(Mounting Example 1 of Light Emitting Device)

Figure 28A:
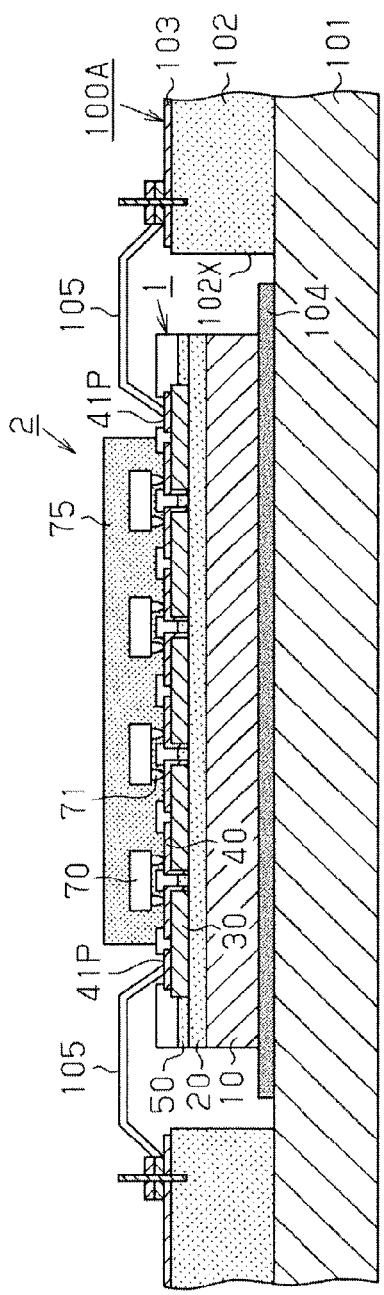
FIGS. 28A and 28B are schematic cross-sectional views illustrating a mounting example of the light emitting device.

FIG. 28A shows a cross-sectional view when the light emitting device 2 is mounted on a mounting board 100A.

The mounting board 100A includes a metal plate 101, an insulating layer 102 formed on the upper surface of the metal plate 101, and a wiring pattern 103 formed on the upper surface of the insulating layer 102. As a material of the metal plate 101, a metal with favorable heat conductivity such as, for example, aluminum and copper may be used. As a material of the insulating layer 102, for example, an insulating resin such as a polyimide resin or an epoxy resin, or a resin material where a filler such as silica or alumina is mixed with the resin may be used. As a material of the wiring pattern 103, for example, copper or a copper alloy may be used.

An opening 102X which exposes a part of the metal plate 101 as a mounting region of the light emitting device 2 is formed in the insulating layer 102. In addition, the light emitting device 2 is mounted in the mounting region, that is, on the metal plate 101 exposed from the opening 102X. Specifically, in the light emitting device 2, the heat sink 10 formed on the lower surface thereof is thermally bonded onto the metal plate 101 by a heat conduction member 104. In addition, the heat conduction member 104 may use, for example, a heat conduction member where a high heat conductivity substance such as, for example, indium (In), silicone (or hydrogen carbide) grease, a metal filler, or a graphite is produced in a sheet form with a resin binder.

In addition, the electrode terminals 41P of the light emitting device 2 mounted on the mounting board 100A are electrically connected to the wiring patterns 103 of the mounting board 100A via spring-like connection terminals 105 (here, lead pins).

According to this structure, since the heat sink 10 of the light emitting device 2 is bonded onto the metal plate 101 of the mounting board 100A, heat generated from the light emitting device 2 can be dissipated to the metal plate 101. At this time, the insulating layers 50 are formed so as to come into contact with a portion of the wiring patterns 30 and the metal layers 40, and thus a heat conduction amount from the wiring patterns 30 and the metal layers 40 to the insulating layers 20 and 50 increases. Therefore, heat generated by the light emitting element 70 can be conducted to the heat sink 10 with efficiency, and, further, heat generated by the light emitting element 70 can be conducted to the metal plate 101 with efficiency.

(Mounting Example 2 of Light Emitting Device)

Figure 28B:
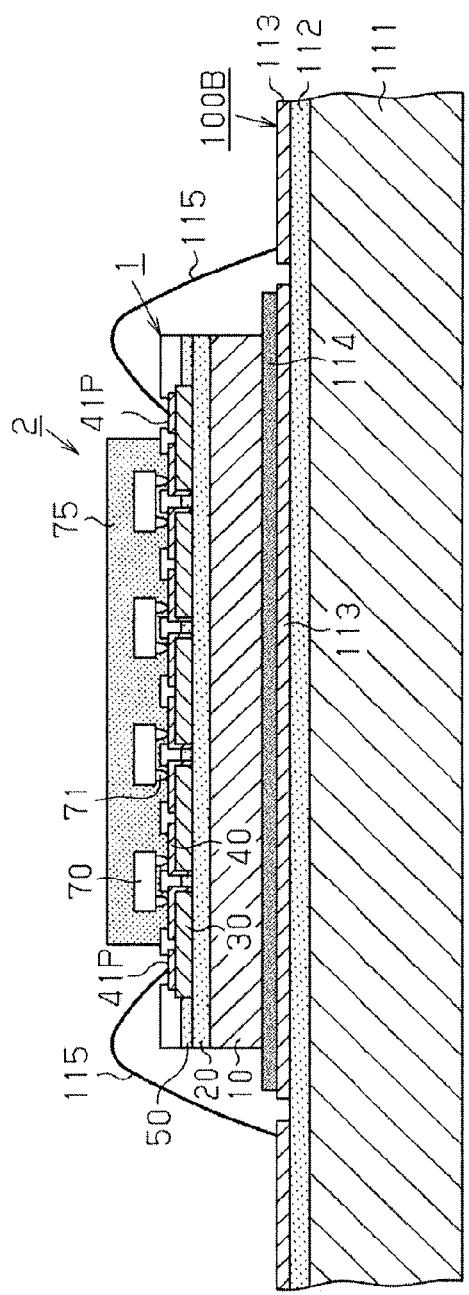

FIG. 28B shows a cross-sectional view when the light emitting device 2 is mounted on a mounting board 100B.

The mounting board 100B includes a metal plate 111, an insulating layer 112 formed on the upper surface of the metal plate 111, and a wiring pattern 113 formed on the upper surface of the insulating layer 112. As a material of the metal plate 111, a metal with favorable heat conductivity such as, for example, aluminum and copper may be used. As a material of the insulating layer 112, for example, an insulating resin such as a polyimide resin or an epoxy resin, or a resin material where a filler such as silica or alumina is mixed with the resin may be used. As a material of the wiring pattern 113, for example, copper or a copper alloy may be used.

The light emitting device 2 is mounted on the wiring pattern 113. Specifically, in the light emitting device 2, the heat sink 10 formed on the lower surface thereof is thermally bonded onto the wiring pattern 113 by a heat conduction member 114. In addition, the heat conduction member 114 may use, for example, a heat conduction member where a high heat conductivity substance such as, for example, indium, silicone (or hydrogen carbide) grease, a metal filler, or a graphite is produced in a sheet form with a resin binder.

In addition, the electrode terminals 41P of the light emitting device 2 mounted on the mounting board 100B are electrically connected to the wiring patterns 113 of the mounting board 100B via bonding wires 115.

According to this structure, since the heat sink 10 of the light emitting device 2 is thermally bonded to the wiring pattern 113 via the heat conduction member 114, heat generated from the light emitting device 2 can be dissipated to the metal plate 111 from the heat sink 10 via the wiring pattern 113 and the insulating layer 112. At this time, the insulating layers 50 are formed so as to come into contact with a portion of the wiring patterns 30 and the metal layers 40, and thus a heat conduction amount from the wiring patterns 30 and the metal layers 40 to the insulating layers 20 and 50 increases. Therefore, heat generated by the light emitting element 70 can be conducted to the heat sink 10 with efficiency, and, further, heat generated by the light emitting element 70 can be conducted to the wiring patterns 113, the insulating layer 112, and the metal plate 111 with efficiency. Further, the wiring pattern 113 which is thermally bonded to the heat sink 10 of the wiring patterns 113 functions as a wiring layer for heat dissipation. In addition, in this mounting example, an opening for exposing the metal plate 111 is not formed in the insulating layer 112; however, in a case where the insulating layer 112 is thin, heat generated from the light emitting device 2 can be dissipated to the metal plate 111 via the insulating layer 112.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A wiring substrate comprising:
   a heat sink;
   a first insulating layer on the heat sink;
   a plurality of wiring patterns on a first surface of the first insulating layer, wherein the wiring patterns are configured to mount light emitting elements thereon, and each wiring pattern includes;
      a first surface,
      a second surface opposite to the first surface of each wiring pattern, the second surface of each wiring pattern facing the first insulating layer, and
      a side surface between the first surface of each wiring pattern and the second surface of each wiring pattern;
   a second insulating layer on the first insulating layer such that the wiring patterns are exposed from the second insulating layer, wherein a surface of the second insulating layer which is opposite to another surface of the second insulating layer with which the first surface of the first insulating layer is in contact is lower than the first surfaces of the wiring patterns, and the second insulating layer covers at least a portion of the side surfaces of the wiring patterns; and
   a first reflective layer on the second insulating layer, wherein the first reflective layer covers another portion of the side surfaces of the wiring patterns and the surface of the second insulating layer which is opposite to said another surface of the second insulating layer.

2. The wiring substrate of claim 1,
   wherein the second insulating layer contacts at least the portion of the side surfaces of the wiring patterns.

3. The wiring substrate of claim 1, wherein a heat conductivity of the first insulating layer and a heat conductivity of the second insulating layer are in a range of 1 W/mK to 10 W/mK.

4. The wiring substrate of claim 1, further comprising:
   metal layers on the wiring patterns to contact the first surfaces of the wiring patterns and the side surfaces of the wiring patterns,
   wherein the light emitting elements are to be mounted on the wiring patterns via the metal layers, and
   wherein the second insulating layer contacts at least a portion of the metal layers.

5. The wiring substrate according to claim 4, wherein
   the first reflective layer has openings such that the metal layers are exposed from the openings, and
   the exposed metal layers serve as pads for mounting the light emitting elements thereon.

6. The wiring substrate of claim 1, wherein the first insulating layer and the second insulating layer are made of the same material.

7. A light emitting device comprising:
   the wiring substrate of claim 1;
   the light emitting elements mounted on the wiring substrate; and
   an encapsulating resin that encapsulates the light emitting elements.

8. The wiring substrate according to claim 1, further comprising:
   metal layers on the wiring patterns, wherein
   the metal layers include first metal layers and second metal layers,
   the wiring patterns are exposed between the first metal layers and the second metal layers,
   the wiring patterns include first wiring patterns and second wiring patterns,
   each first metal layer formed on the second wiring pattern and the corresponding second metal layer formed on the first wiring pattern, which is adjacent to the second wiring pattern, constitute a pair of pads, and
   the first reflective layer is formed on a part, between the first and second metal layers, of the first surface of each first wiring pattern.

9. A wiring substrate comprising:
   a heat sink;
   a first insulating layer on the heat sink;
   a plurality of wiring patterns on a first surface of the first insulating layer, wherein the wiring patterns are configured to mount light emitting elements thereon, each wiring pattern includes
      a first surface,
      a second surface opposite to the first surface of each wiring pattern, the second surface of each wiring pattern facing the first insulating layer, and
      a side surface between the first surface of each wiring pattern and the second surface of each wiring pattern,
   the first insulating layer covers a portion of the side surfaces of the wiring patterns, and a surface of the first insulating layer is lower than the first surfaces of the wiring patterns;
   metal layers on the wiring patterns, wherein the metal layers completely cover the first surfaces of the wiring patterns; and
   a first reflective layer on the first insulating layer, wherein the first reflective layer covers the remaining portion of the side surfaces of the wiring patterns, and the first reflective layer contacts entire side surfaces of the metal layers, and exposed surfaces of the metal layers are flush with an exposed surface of the first reflective layer.

10. A wiring substrate comprising:
    a heat sink;
    a first insulating layer on the heat sink;
    a plurality of wiring patterns on the first insulating layer, wherein the wiring patterns are configured to mount light emitting elements thereon, each wiring pattern includes a first surface,
a second surface opposite to the first surface of each wiring pattern, the second surface of the wiring pattern facing the first insulating layer, and
a side surface between the first surface of each wiring pattern and the second surface of each wiring pattern,
the first insulating layer covers a portion of the side surfaces of the wiring patterns, and a surface of the first insulating layer is lower than the first surfaces of the wiring patterns; and
a first reflective layer that is formed so as to cover a part of the first surfaces of the wiring patterns, a part of the side surfaces of the wiring patterns, and the surface of the first insulating layer.

* * * * *